(12) United States Patent  
Lin et al.

(10) Patent No.: US 11,974,410 B1  
(45) Date of Patent: Apr. 30, 2024

(54) ELECTRONIC DEVICE WITH CONNECTOR INTERFACE FOR ROTATING EXTERNAL CONNECTOR

(71) Applicant: Samsara Inc., San Francisco, CA (US)

(72) Inventors: Jennifer Lin, San Francisco, CA (US); Christian Almer, San Francisco, CA (US); Somasundara Pandian, San Francisco, CA (US); Li-Wei Cheng, New Taipei (TW); David Gal, Oakland, CA (US)

(73) Assignee: Samsara, Inc., San Francisco, CA (US)

( * ) Notice: Subject to any disclaimer, the term of this patent is extended or adjusted under 35 U.S.C. 154(b) by 8 days.

(21) Appl. No.: 17/817,961

(22) Filed: Aug. 5, 2022

(51) Int. Cl.
| | |
|---|---|
| *H05K 5/02* | (2006.01) |
| *H01R 24/00* | (2011.01) |
| *H01R 24/76* | (2011.01) |
| *H01R 24/86* | (2011.01) |
| *H05K 7/14* | (2006.01) |

(52) U.S. Cl.
CPC ......... *H05K 7/1452* (2013.01); *H01R 24/005* (2013.01); *H01R 24/76* (2013.01); *H01R 24/86* (2013.01); *H05K 5/0217* (2013.01); *H05K 5/0247* (2013.01)

(58) Field of Classification Search
USPC ........ 361/752, 728, 796, 800, 807, 809, 810
See application file for complete search history.

(56) References Cited

U.S. PATENT DOCUMENTS

| | | | | |
|---|---|---|---|---|
| 6,030,247 | A * | 2/2000 | Sasahara | H01R 13/20 439/79 |
| 10,270,281 | B1 * | 4/2019 | Priest | H02K 1/12 |
| 2007/0278996 | A1 * | 12/2007 | So | H01R 13/447 320/107 |
| 2011/0081796 | A1 * | 4/2011 | Poh | H01M 50/216 439/271 |
| 2015/0214659 | A1 * | 7/2015 | Thiel | H01R 13/639 439/341 |
| 2016/0316862 | A1 * | 11/2016 | Ho | H04M 1/026 |
| 2019/0252895 | A1 * | 8/2019 | Kissel | H02J 7/0045 |

OTHER PUBLICATIONS

U.S. Appl. No. 17/818,881, filed Aug. 10, 2022, 38 pages.

* cited by examiner

*Primary Examiner* — Hung S. Bui
(74) *Attorney, Agent, or Firm* — Nicholson, De Vos, Webster & Elliott, LLP

(57) ABSTRACT

Aspects discussed herein include an electronic device and an associated connector interface. The electronic device comprises an enclosure that defines an internal volume, a plurality of external surfaces, and a recess from an external surface of the plurality of external surfaces. The recess has circumferential slot(s) extending to the external surface and that receive flange(s) of an external connector. The electronic device further comprises a connector interface connected with one or more electronic components disposed in the internal volume. The connector interface comprises first conductor(s) that are exposed at the recess. While the flange(s) are received in the circumferential slot(s), rotation of the external connector causes the flange(s) to slide within the circumferential slot(s) into a retained position, in which second conductor(s) of the external connector, having a fixed disposition relative to the flange(s), are connected to the first conductor(s).

18 Claims, 18 Drawing Sheets

ELECTRONIC DEVICE WITH CONNECTOR INTERFACE FOR ROTATING EXTERNAL CONNECTOR

TECHNICAL FIELD

Embodiments described herein are directed to a connector interface for a rotating external connector, and more specifically, to implementations of a connector interface for a sensor-enabled electronic device that is particularly suitable for deployment in portable or movable platforms.

BACKGROUND ART

Vehicles are used for transportation of passengers and/or cargo, which in some cases may cover significant distances (e.g., hundreds or thousands of miles). The environmental parameters of one or more compartments of the vehicle may be monitored (sometimes in real-time) during a duration of the transport to ensure a suitable environment for the passengers and/or cargo being transported by the vehicle. Some monitored compartments may be required to support relatively harsh environments, such as high humidity and/or high temperature, low temperature, and so forth.

External sensors (such as temperature probes) may be used to remotely acquire measurements and may be connected to an electronic device using a connector interface. The physical connection of the external sensors with the connector interface may be degraded by various factors during the transportation process. In one example, a user connecting the external sensors may not have fully secured the connection (e.g., only loosely attached). In another example, the movement of the vehicle may introduce vibrations that degrade the connection. Various operations of the passenger and/or cargo transport (e.g., passengers embarking and disembarking from a passenger compartment, loading and unloading cargo from a cargo compartment) may require persons to transit the compartments, which increases the chances of the connection being bumped or jostled. Further, other operations may be routinely or occasionally performed on the compartments of the vehicle, such as cleaning, repairing, and reconfiguring, that requires persons to transit the compartments.

BRIEF DESCRIPTION OF THE DRAWINGS

The following figures use like reference numbers to refer to like elements. Although the following figures depict various exemplary embodiments, alternative embodiments are within the spirit and scope of the appended claims. In the drawings:

DETAILED DESCRIPTION

Figure 1A:
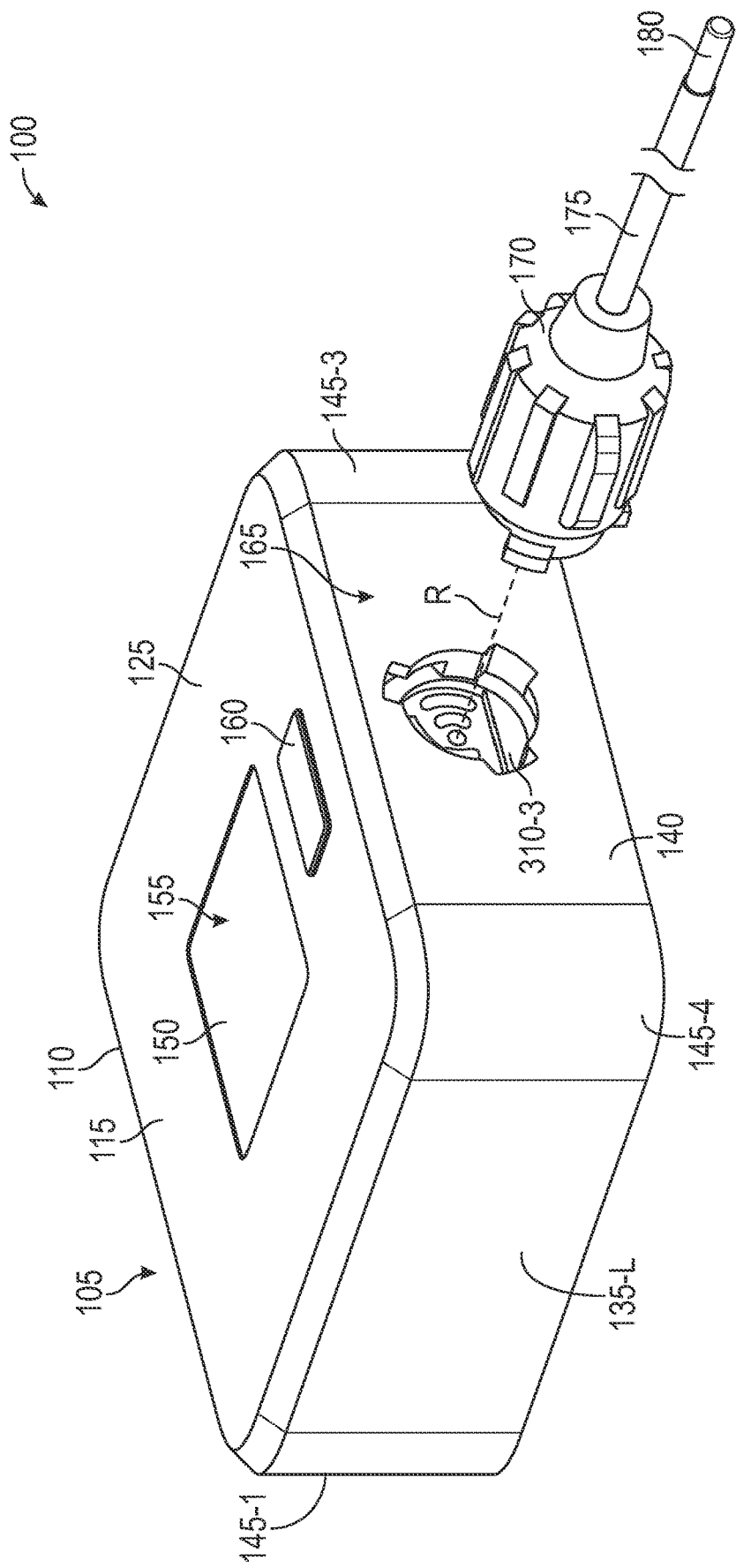
FIG. 1A provides a perspective view of an electronic device having an exemplary connector interface at a bottom surface of an enclosure, according to one or more embodiments.

Embodiments described herein are directed to implementations of a connector interface, which may be included in (or integrated into) an electronic device or included in a separate connector such as in a connectorized cable. In one exemplary embodiment, an electronic device comprises an enclosure that defines an internal volume, a plurality of external surfaces, and a recess from an external surface of the plurality of external surfaces. The recess has one or more circumferential slots that extend to the external surface and that receive one or more flanges of an external connector. The electronic device further comprises one or more electronic components disposed in the internal volume, and a connector interface connected with the one or more electronic components. The connector interface comprises one or more first conductors that are exposed at the recess. While the one or more flanges are received in the one or more circumferential slots, rotation of the external connector causes the one or more flanges to slide within the one or more circumferential slots into a retained position of the external connector, in which one or more second conductors of the external connector, having a fixed disposition relative to the one or more flanges, are connected to the one or more first conductors.

In another exemplary embodiment, a connector interface comprises a body defining a first surface, a recess from the first surface, and a second surface disposed at the recess and recessed from the first surface. The recess has one or more circumferential slots that extend into the body from the first surface. The connector interface further comprises one or more first conductors that are exposed at the second surface. While one or more flanges of an external connector are received in the one or more circumferential slots, relative rotation of the body with the external connector causes the one or more flanges to slide within the one or more circumferential slots into a retained position of the external connector, in which one or more second conductors of the external connector, having a fixed disposition relative to the one or more flanges, are connected to the one or more first conductors.

In some embodiments, the one or more first conductors of the connector interface include one or more arcuate conductors that connect to a corresponding one or more of the plurality of second conductors for a range of rotational positions of the external connector including the retained position. In some embodiments, the one or more first conductors comprise a plurality of first conductors in a concentric disposition, which may include a central conductor and a plurality of arcuate conductors.

Beneficially, the connector interface provides a selective connection of the first conductor(s) and the second conductor(s) at certain rotational positions of the external connector and/or a continuous connection of the first conductor(s) and the second conductor(s) for a range of rotational positions of the external connector. In this way, the connector interface may support a sequenced connection of the first conductor(s) and the second conductor(s), such as connecting one or more power-carrying conductors prior to connecting one or more signal-carrying conductors. The continuous connection of the first conductor(s) and the second conductor(s) may also provide a more resilient connection that can remain connected despite a loose attachment of the external connector, vibrations during movement, being bumped or jostled by persons, and so forth. Further, in some embodiments, forming the connection between the first conductor(s) and the second conductor(s) applies a compressive force therebetween, which also improves the resiliency of the connection.

FIG. 1A provides a perspective view 100 of an electronic device 105 (also referred to herein as a sensor device) having an exemplary connector interface 165 at a bottom surface 140 of an enclosure 110, according to one or more embodiments.

The electronic device 105 comprises the enclosure 110 that defines an internal volume and a plurality of external surfaces. The enclosure 110 houses one or more components that provide various functionality of the electronic device 105. As shown, the enclosure 110 comprises a first cover member 115 (e.g., a cap) and a second cover member 120 (shown in FIG. 8B; e.g., a base plate) that are removably attachable with each other, e.g., using threaded fasteners distributed around a perimeter of the enclosure 110. In other implementations, the enclosure 110 may include different numbers of cover members, e.g., being formed of a single cover member that defines the internal volume and the plurality of external surfaces.

In some embodiments, the enclosure 110 prevents the ingress of liquids (e.g., water) and/or particulates (e.g., dust) into the internal volume of the enclosure 110. In some embodiments, the second cover member 120 removably attaches to the first cover member 115 to form a sealed interface that seals the internal volume from the ambient environment. For example, one of the first cover member 115 and the second cover member 120 may include a gasket or other compliant material that contacts the other of the first cover member 115 and the second cover member 120 to form the sealed interface. In some embodiments, the enclosure 110 may have an Ingress Protection (IP) Code rating, such as IP66, IP66K, IP67, IP68, IP69K, and so forth. By limiting or preventing ingress of liquids and/or particulates into the internal volume, the electronic device 105 may provide increased longevity and increased reliability of the components in the internal volume. Further, in some cases the electronic device 105 having ingress protection may be deployed and reliably operate in harsher environments. In one example, the electronic device 105 may be deployed in a cargo compartment of a truck or trailer (e.g., attached to a wall of the cargo compartment), and the electronic device 105 may remain deployed during washing (e.g., power washing) or other cleaning of the cargo compartment.

The first cover member 115 defines a front surface 125, a top surface 130 (shown in FIGS. 8A, 8B, 9), side surfaces 135-L, 135-R (right side; shown in FIGS. 8A, 8B, 9), and a bottom surface 140 of the enclosure 110, and the second cover member 120 defines a rear surface 845 (shown in FIG. 8B) of the enclosure 110. The front surface 125, the top surface 130, the side surfaces 135-L, 135-R, the bottom surface 140, and the rear surface may be referred to generically or collectively as external surface(s) of the enclosure 110.

As shown, the external surfaces of the enclosure 110 are planar, although other configurations are also contemplated. In some embodiments, the front surface 125 is in a first plane, and the top surface 130, the side surfaces 135-L, 135-R, and the bottom surface 140 are in respective second planes that are orthogonal to the first plane. In some embodiments, when the first cover member 115 and the second cover member 120 are attached, the rear surface 845 is in a third plane that is parallel to the first plane and orthogonal to each of the second planes.

The enclosure 110 may have any suitable external profile. In some embodiments, the external surfaces of the enclosure 110 extend to each other (e.g., forming right angle interfaces with each other). In some embodiments, the enclosure 110 further includes transition sections between different ones of the front surface 125, the top surface 130, the side surfaces 135-L, 135-R, the bottom surface 140, and the rear surface 845, where the transition sections may also form external surfaces of the enclosure 110. In another example, the transition sections include curved corner sections 145-1, 145-2 (shown in FIGS. 8A, 8B, 9), 145-3, 145-4 that extend between various pairs of the top surface 130, the side surfaces 135-L, 135-R, and the bottom surface 140. In another example, and as shown in the view 100, the transition sections include beveled edges that extend between the front surface 125 and each of the top surface 130, the side surfaces 135-L, 135-R, the bottom surface 140, and the curved corner sections 145-1, 145-2, 145-3, 145-4. Beneficially, the transition sections of the enclosure 110 allow the electronic device 105 to have a reduced external profile, which reduces the likelihood of the electronic device 105 being intentionally or incidentally contacted (e.g., bumped or snagged) while deployed, and/or reduces the likelihood of such contact causing dislocation or damage to the electronic device 105.

The front surface 125 of the enclosure 110 defines an opening 150 extending through the first cover member 115. As shown, the opening 150 is disposed near a center of the front surface 125 and is square-shaped. A window 155 is disposed in the opening 150 that provides visible transmissivity into the internal volume of the enclosure 110 through the first cover member 115 while maintaining the ingress protection of the enclosure 110. Any suitable arrangement and/or materials of the window 155 are contemplated. In one non-limiting example, the window 155 is formed of an acrylic, such as poly(methyl methacrylate) (PMMA). The window 155 may be adhered to the first cover member 115 using a suitable adhesive. The window 155 may be recessed slightly from the front surface 125, such as 0.05 millimeter (mm). In an alternate implementation, the front surface 125 comprises a sheet of material (e.g., acrylic) that is masked (e.g., silkscreen painted) to define the transparent window 155 and the non-transparent portions of the front surface 125.

In some embodiments, a display device of the electronic device 105 is disposed beneath the window 155, such that the display device is viewable at the front surface 125 through the window 155 (e.g., from outside the electronic device 105). In some embodiments, the electronic device 105 comprises an input device 160 disposed at the front surface 125 and that maintains the ingress protection of the enclosure 110. Although the input device 160 is depicted as a physical button extending outwardly from the front surface 125, alternate implementations of the input device 160 may have other forms and/or may be disposed at different external surface(s) of the enclosure 110. Further, alternate implementations may have multiple input devices 160 disposed at one or more of the external surfaces of the enclosure 110. Alternate implementations of the input device 160 may use any suitable input sensing technology (e.g., resistive, capacitive, inductive, optical). For example, the input device 160 may be a capacitive sensing device that is also disposed at the window 155. In some embodiments, the display device and the input device 160 may overlap with each other and/or may include shared circuitry (e.g., substantially transparent electrodes).

The input device 160 and the display device are connected with each other through one or more computer processors of the electronic device 105 that are disposed in the internal volume. In some embodiments, the displayed content (e.g., information) on the display device is responsive to inputs received at the input device 160. For example, receiving a first press at the input device 160 may activate the display device and may cause a current temperature measurement to be displayed, receiving a second press at the input device 160 may display a measurement of a different parameter monitored by the electronic device 105, and so forth. In this way, receiving multiple inputs at the input device 160 may cause the display device to cycle through a predefined sequence of presenting information to a user. In some embodiments, inputs received at the input device 160 may provide user configuration information for the electronic device 105.

In some embodiments, the side surface 135-R defines an opening 805 (shown in FIGS. 8A, 8B, 9) extending through the first cover member 115. As shown, the opening 805 is disposed near a center of the side surface 135-R and is rectangular-shaped. A thermal member 810 is disposed in the opening 805 that provides improved thermal conductivity, when compared with other portions of the enclosure 110, while maintaining the ingress protection of the enclosure 110. The thermal member 810 is thermally contacted to a temperature sensor that is disposed within the internal volume of the enclosure 110. The thermal member 810 improves the thermal responsivity of the electronic device 105 and supports greater sampling rates of the temperature of the ambient environment while maintaining the ingress protection of the enclosure 110. As will be discussed in greater detail below, the thermal member 810 may be formed of any suitable material(s) and may have any dimensioning that provides a suitable thermal conductivity for the temperature sensor, and that provides suitable strength to maintain the ingress protection of the enclosure 110. In some embodiments, the thermal member 810 comprises a metal, such as aluminum or stainless steel.

Figure 1B:
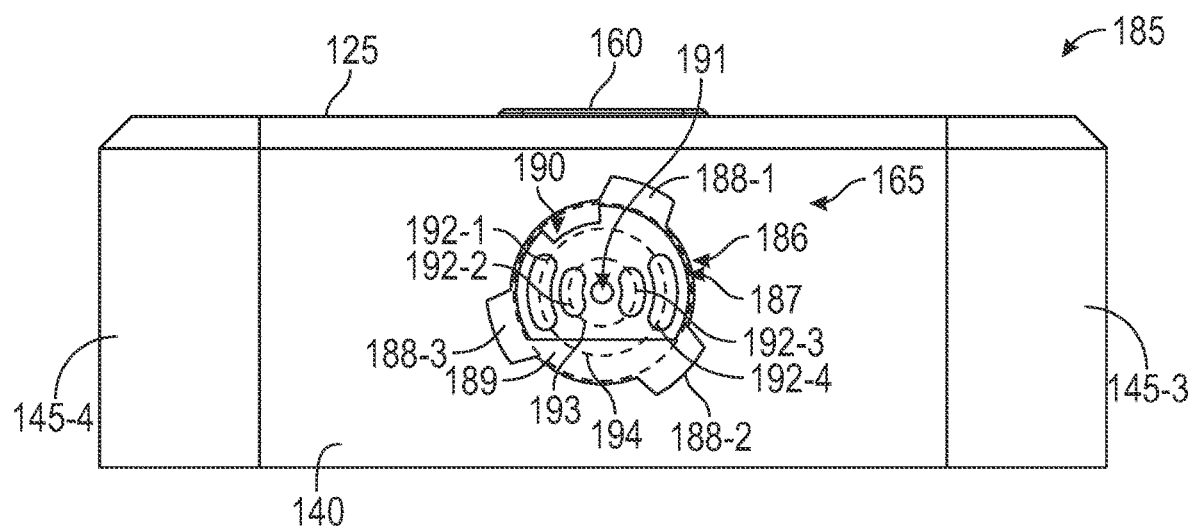
FIG. 1B provides a bottom view of the exemplary connector interface, according to one or more embodiments.
Figure 1C:
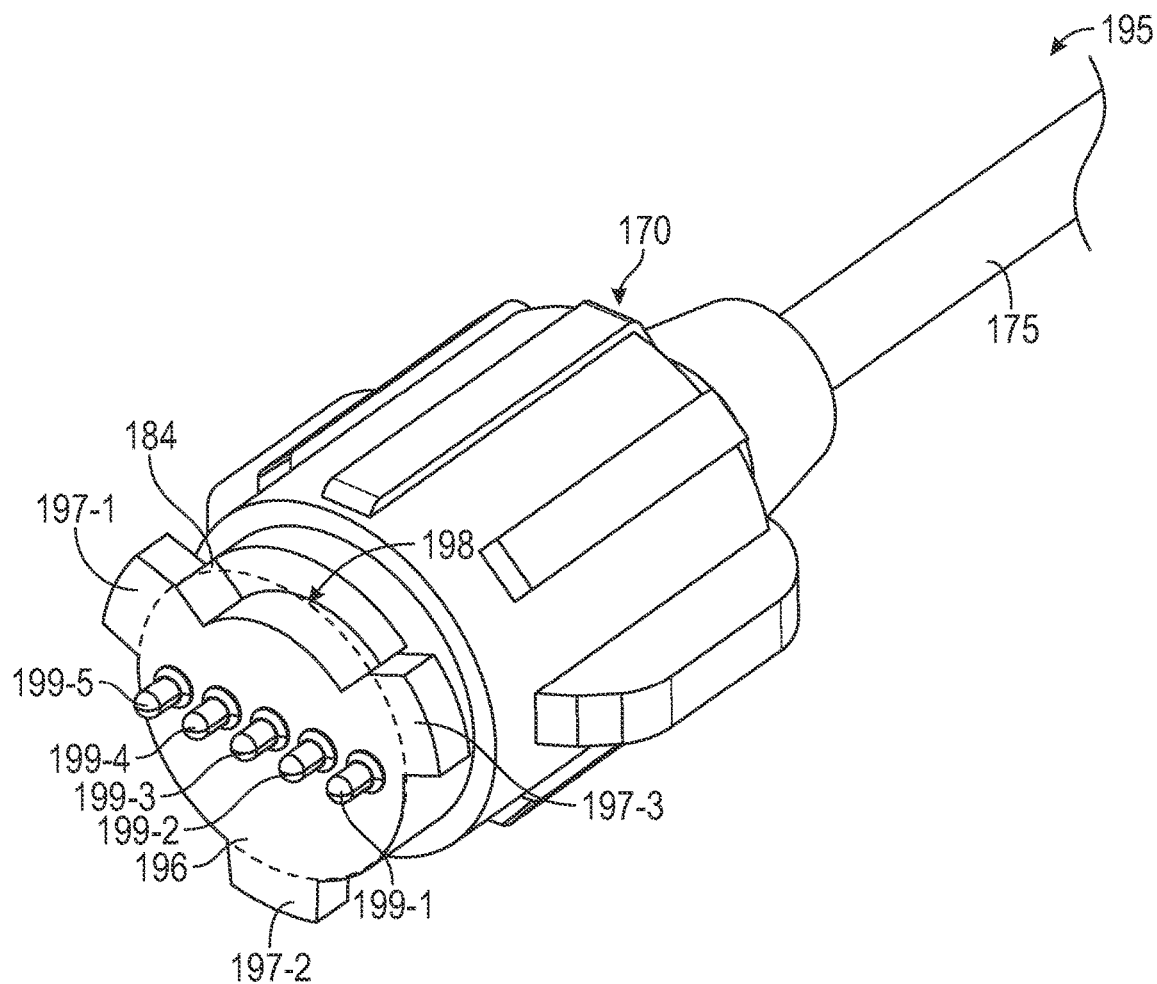
FIG. 1C provides a perspective view of an exemplary external connector, according to one or more embodiments.

Referring also to FIGS. 1B and 1C, the connector interface 165 is disposed at the bottom surface 140 of the enclosure 110. An external connector 170 of a connectorized cable 175 removably attaches to the electronic device 105 through the connector interface 165, and conductors of the external connector 170 connect through conductors of the connector interface 165 to one or more electronic components disposed in the internal volume of the electronic device 105. In one embodiment, an external temperature sensor 180 is connected via the connectorized cable 175 to the external connector 170, and the temperature measurements acquired by the external temperature sensor 180 and/or other data may be transmitted through the connector interface 165 to one or more computer processors of the electronic device 105. In other embodiments, the connector interface 165 may be used to connect the electronic device 105 to other suitable types of sensors or to other electronic devices.

In the bottom view 185, a recess 186 extends into a structure of the enclosure 110 (e.g., partly through a wall of the enclosure 110). More specifically, the recess 186 extends from the bottom surface 140 to a recessed surface 189. The recess 186 defines a central recess 187 and a plurality of circumferential slots 188-1, 188-2, 188-3 that are spaced apart from each other along a circumference of the central recess 187. As shown, the plurality of circumferential slots 188-1, 188-2, 188-3 are evenly distributed along the circumference of the central recess 187 (i.e., three slots spaced apart by 120 degrees). Other numbers of the circumferential slots are also contemplated (e.g., one, two, four or more), as well as different spacing between the circumferential slots (which may include irregular spacing).

In some embodiments, the central recess 187 has a substantially cylindrical shape, although the central recess 187 may be contoured differently in other implementations. As shown, the plurality of circumferential slots 188-1, 188-2, 188-3 are in fluid communication with the central recess 187, although alternate implementations may have some or all of the plurality of circumferential slots 188-1, 188-2, 188-3 spaced apart from the central recess 187.

A plurality of first conductors 191, 192-1, 192-2, 192-3, 192-4 are exposed to the recess 186 at the recessed surface 189. In some embodiments, the connector interface 165 includes a printed circuit board (PCB) that partly or fully defines the recessed surface 189, and the plurality of first conductors 191, 192-1, 192-2, 192-3, 192-4 are disposed on the PCB. In some embodiments, each of the plurality of first conductors 191, 192-1, 192-2, 192-3, 192-4 has a planar endface at the recessed surface 189. In one example, the endfaces of the plurality of first conductors 191, 192-1, 192-2, 192-3, 192-4 are coplanar with each other. In another example, the endfaces of the plurality of first conductors 191, 192-1, 192-2, 192-3, 192-4 are in a non-coplanar disposition, e.g., having staggered depths relative to the bottom surface 140.

In some embodiments, and as shown, the plurality of first conductors 191, 192-1, 192-2, 192-3, 192-4 have a concentric disposition. In some embodiments, the center of the concentric disposition corresponds to an axis of rotation R of the external connector 170. The plurality of first conductors 191, 192-1, 192-2, 192-3, 192-4 comprise a central conductor 191 and a plurality of arcuate conductors 192-1, 192-2, 192-3, 192-4. In some embodiments, and as shown, the central conductor 191 has a circular shape, the arcuate conductors 192-2, 192-3 each have a radius of curvature corresponding to a first circle 193 with a greater surface area than that of the central conductor 191, and the arcuate conductors 192-1, 192-4 each have a radius of curvature corresponding to a second circle 194 with a greater surface area than the first circle 193. As shown, the plurality of arcuate conductors 192-1, 192-2 have a same arc angle measurement and align with each other, and the plurality of arcuate conductors 192-3, 192-4, have a same arc angle measurement and align with each other. The length of the arcuate conductors 192-1, 192-4 is longer than the length of the arcuate conductors 192-2, 192-3.

Other implementations may include different numbers and/or different dispositions of the plurality of first conductors 191, 192-1, 192-2, 192-3, 192-4 that provide a selective connection with one or more conductors of the external connector 170 at certain rotational positions and/or continuous connection with one or more conductors of the external connector 170 at multiple rotational positions. For example, other implementations may omit the central conductor 191, may substitute annular conductors for one or more of the arcuate conductors 192-1, 192-2, 192-3, 192-4, may include conductors that extend substantially along the first circle 193 or the second circle 194 but are not arcuate (e.g., formed as linear segments), and so forth. In some embodiments, the selective connection and/or continuous connection with the one or more conductors of the external connector 170 supports a sequenced connection or disconnection of the external connector 170 with the connector interface 165.

An end portion 196 of the external connector 170 defines a central endface 184 that is substantially circular, as well as flanges 197-1, 197-2, 197-3 disposed along a circumference of the central endface 184. The circle of the central endface 184 has a surface area that is less than the surface area of the circle of the central recess 187, such that the central endface 184 may be received into the central recess 187 when the flanges 197-1, 197-2, 197-3 are aligned with, and received into, the circumferential slots 188-1, 188-2, 188-3. As shown, the flanges 197-1, 197-2, 197-3 are evenly distributed (e.g., three flanges 197-1, 197-2, 197-3 that are spaced apart by 120 degrees), although different numbers of the flanges 197-1, 197-2, 197-3 and different spacing between the flanges 197-1, 197-2, 197-3 (including irregular spacing) are also contemplated.

The external connector 170 further comprises a plurality of second conductors 199-1, 199-2, . . . , 199-5 projecting from the end portion 196 of the external connector 170. The plurality of second conductors 199-1, 199-2, . . . , 199-5 have a linear disposition, although other dispositions are also contemplated. The plurality of second conductors 199-1, 199-2, . . . , 199-5 have a fixed disposition relative to the flanges 197-1, 197-2, 197-3.

Figure 3A:
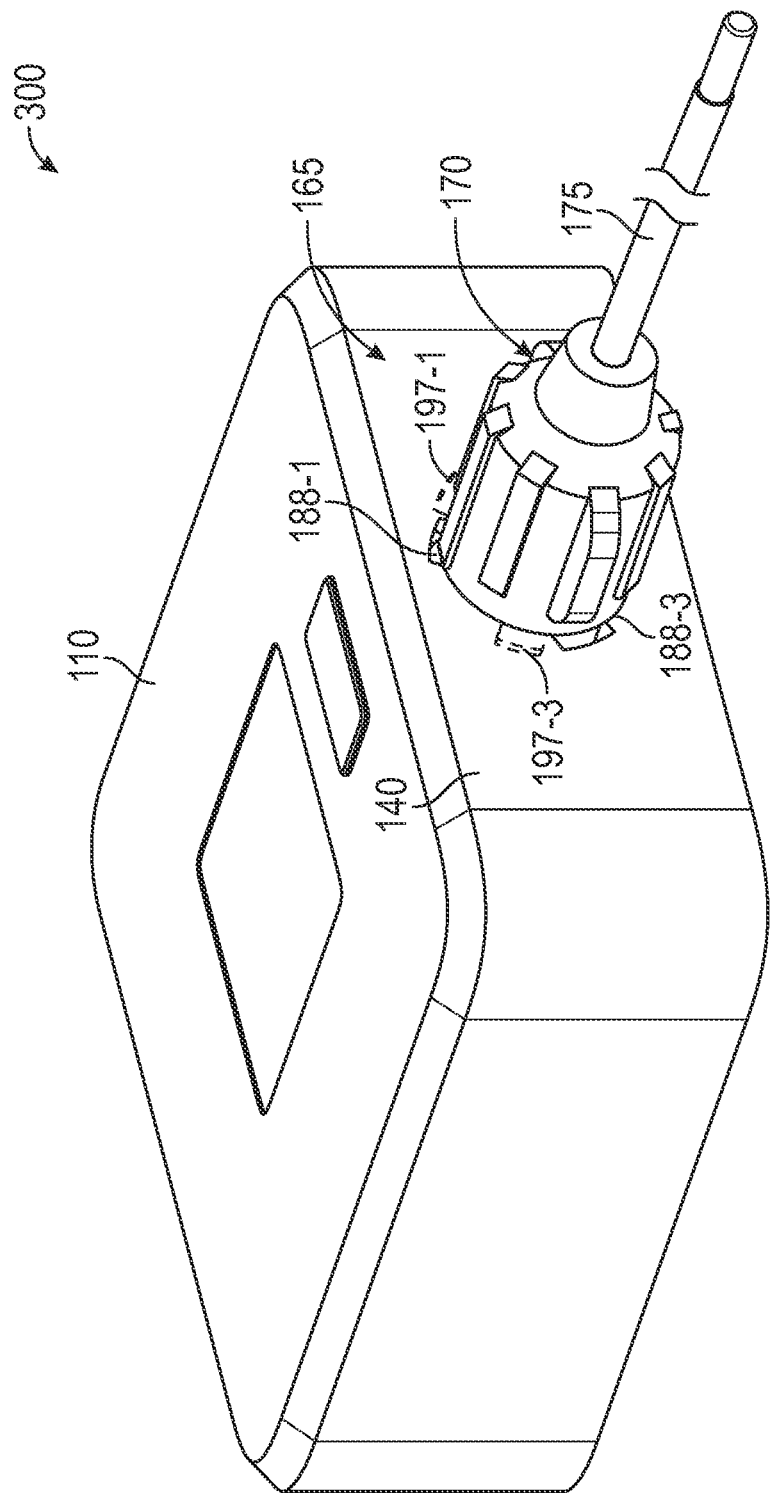
FIG. 3A provides a perspective view of the electronic device with the external connector received in the connector interface in a second rotational position, according to one or more embodiments.

In some embodiments, the connector interface 165 and the external connector 170 are dimensioned such that forming the connection between the plurality of first conductors 191, 192-1, 192-2, 192-3, 192-4 and the plurality of second conductors 199-1, 199-2, . . . , 199-5 applies a compressive force therebetween, which tends to improve the conductive connections. In one non-limiting example, the compressive force is between 70 to 150 grams-force (gf) per first conductor 191, 192-1, 192-2, 192-3, 192-4, although other values of compressive force are also contemplated. In some embodiments, and as shown in cross-section view 320 of FIG. 3D, the plurality of second conductors 199-1, 199-2, . . . , 199-5 comprise spring-loaded pins (also referred to as "pogo pins"), and the plurality of first conductors 191, 192-1, 192-2, 192-3, 192-4 comprise planar lands (also referred to as "targets") on a PCB 325 or other substrate. The plungers of the spring-loaded pins are displaced, and the springs of the spring-loaded pins compressed, when the external connector 170 is attached to the connector interface 165.

In some embodiments, the central endface 184 is contoured to define a recess 198 disposed between two of the flanges 197-1, 197-3. The connector interface 165 further comprises a projection 190 that is recessed from the bottom surface 140 and that extends into the central recess 187. As the portions of the external connector 170 are received into the recess 186, the projection 190 is received into the recess 198 only when the external connector 170 is in a correct orientation. Otherwise, when the external connector 170 has an incorrect orientation, the projection 190 contacts the central endface 184, limiting the insertion of the external connector 170 into the recess 186 and preventing the connection of the plurality of first conductors 191, 192-1, 192-2, 192-3, 192-4 with the plurality of second conductors 199-1, 199-2, . . . , 199-5. Stated another way, the combination of the projection 190 and the recess 198 ensures a correct orientation of the external connector 170 when connecting the plurality of first conductors 191, 192-1, 192-2, 192-3, 192-4 with the plurality of second conductors 199-1, 199-2, . . . , 199-5. Other techniques are also contemplated for ensuring the correction orientation of the external connector 170, such as an irregular spacing of the flanges 197-1, 197-2, 197-3 and the corresponding circumferential slots 188-1, 188-2, 188-3.

Figure 2A:
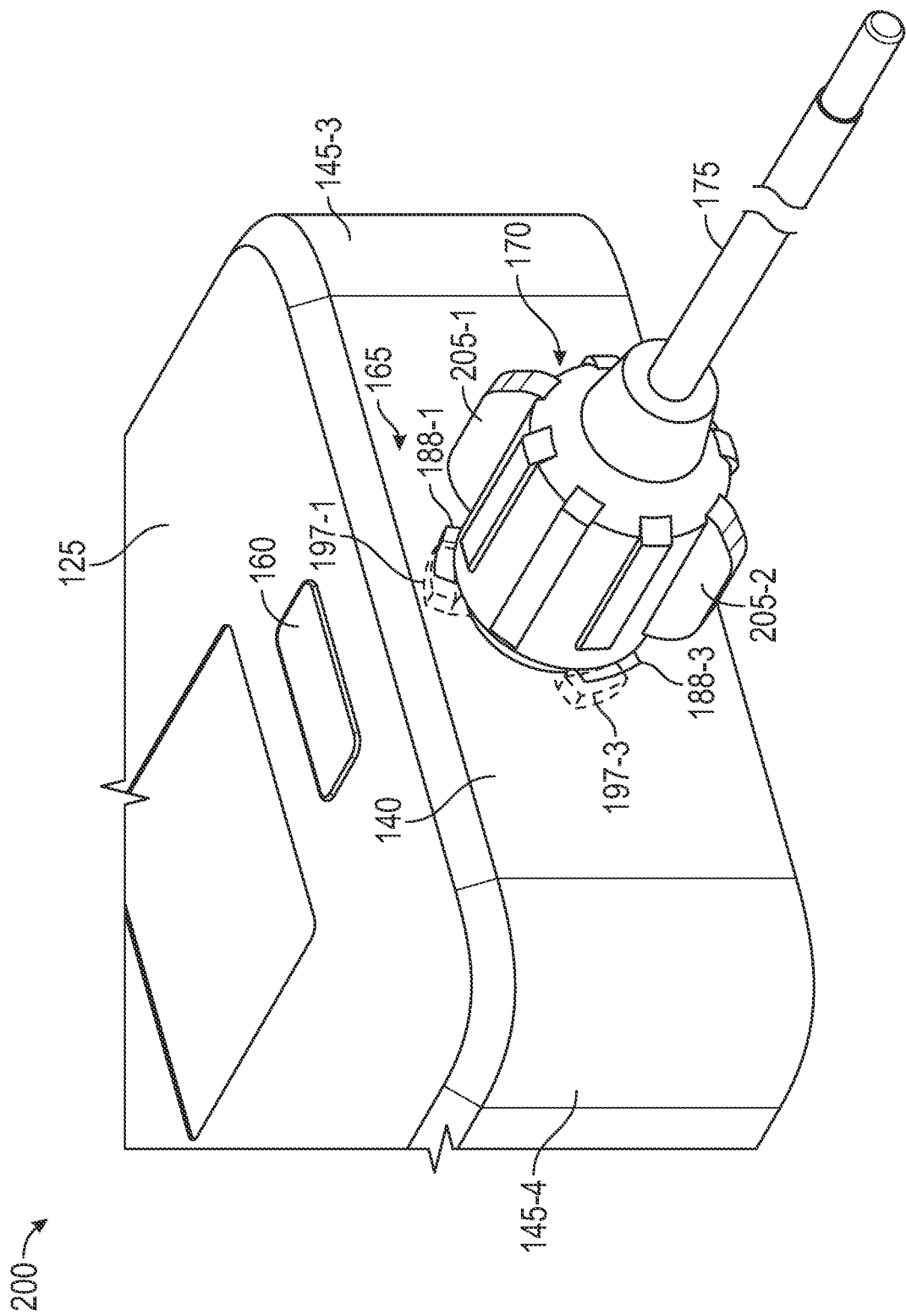
FIG. 2A provides a perspective view of the electronic device with the external connector received in the connector interface in a first rotational position, according to one or more embodiments.

FIG. 2A provides a perspective view 200 of the electronic device 105 with the external connector 170 received in the connector interface 165 in a first rotational position, according to one or more embodiments. The external connector 170 defines fins 205-1, 205-2 at opposing circumferential positions of the external connector 170, and which may be used to accommodate user manipulation of the external connector 170 (e.g., improving user grip for insertion and/or rotation of the external connector 170).

Figure 2B:
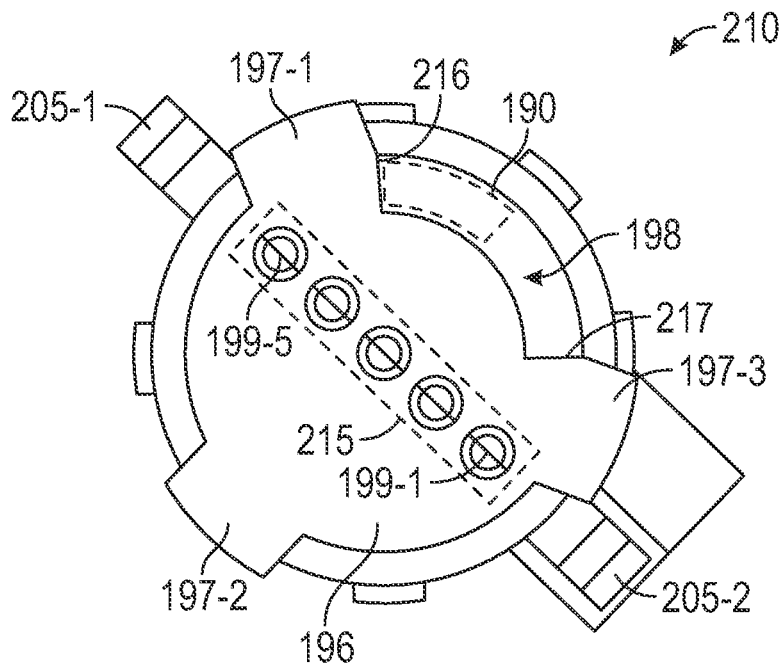
FIG. 2B provides an end view of the external connector in the first rotational position, according to one or more embodiments.

When the external connector 170 is in the first rotational position, the central endface 184 is aligned with the central recess 187, the flanges 197-1, 197-2, 197-3 are aligned with respective ones of the circumferential slots 188-1, 188-2, 188-3, and the projection 190 is aligned with the recess 198. When the external connector 170 is in the first rotational position, the plurality of second conductors 199-1, 199-2, ..., 199-5 has an orientation 215 as shown in the end view 210 of FIG. 2B. When aligned, the various portions of the external connector 170 may be received into the corresponding portions of the connector interface 165, e.g., responsive to the user applying an insertion force to the external connector 170. In some embodiments, when the external connector 170 is received into the connector interface 165, the projection 190 is disposed near a sideface 216 of the end portion 196 that partly defines the recess 198 (and in some cases may contact the sideface 216).

Figure 2C:
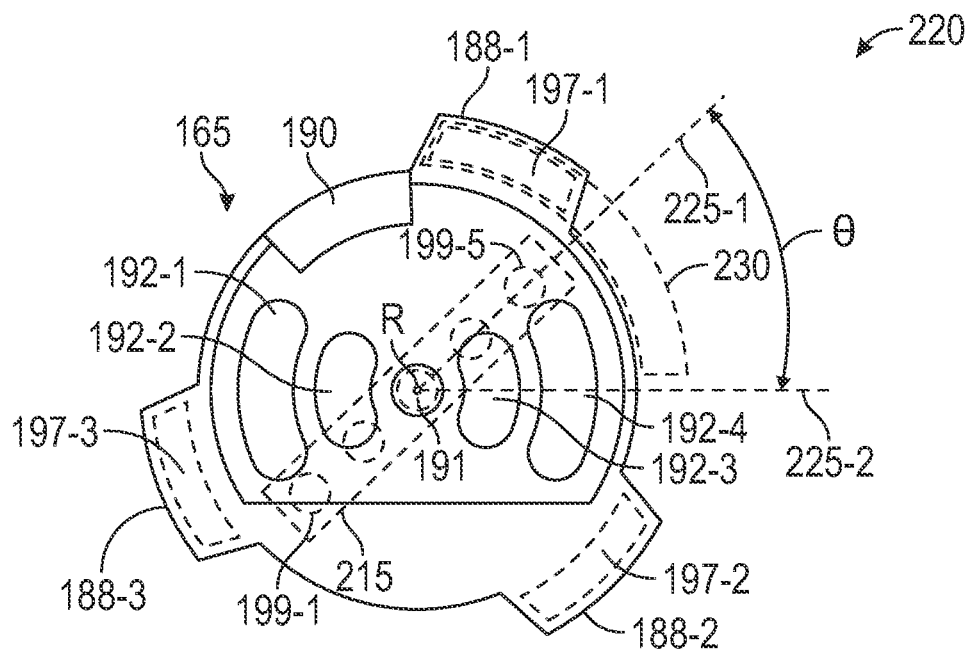
FIG. 2C provides an end view of the connector interface overlaid with portions of the external connector in the first rotational position, according to one or more embodiments.

The orientation 215 of the plurality of second conductors 199-1, 199-2, ..., 199-5 is shown in end view 220 of FIG. 2C overlaid with the plurality of first conductors 191, 192-1, 192-2, 192-3, 192-4. In the orientation 215, the plurality of second conductors 199-1, 199-2, ..., 199-5 are linearly aligned along a first angle 225-1. The second conductor 199-3 overlaps (and when the external connector 170 is received into the connector interface 165, is connected to) the central conductor 101, the second conductors 199-2, 199-4 partly overlap (and when the external connector 170 is received, are connected to) the arcuate conductors 192-2, 192-3, and the second conductors 199-1, 199-5 do not overlap the arcuate conductors 192-1, 192-5 (so that when the external connector 170 is received, the second conductors 199-1, 199-5 do not contact the arcuate conductors 192-1, 192-5).

When the external connector 170 is received into the connector interface 165, the user applies a rotational force to the external connector 170 toward a retained position. In the end view 220, rotation of the external connector 170 in a clockwise direction from the first rotational angle 225-1 to the retained position corresponding to a second rotational angle 225-2. During rotation toward the retained position, the flange 197-1 slides (or otherwise advances) within a circumferential portion 230 of the corresponding circumferential slot 188-1, such that the flange 197-1 is disposed between portions of the enclosure 110 (e.g., behind the bottom surface 140). The rotation also causes each of the flanges 197-2, 197-3 to slide (or advance) within circumferential portions (not shown) of the corresponding circumferential slots 188-2, 188-3 to be disposed between portions of the enclosure 110 as shown in the perspective view 300 of FIG. 3A and the end view 315 of FIG. 3C. In some embodiments, the angular difference Θ between the first rotational angle 225-1 and the second rotational angle 225-2 is about 45 degrees, although other values of the angular difference Θ, including values that are less than 45 degrees, are also contemplated. Beneficially, using the implementations of the connector interface 165 and the external connector 170 described herein, relatively small values of the angular difference Θ are sufficient to retain the external connector 170.

In some embodiments having the projection 190, rotation of the external connector 170 toward the retained position causes the projection 190 to advance within the recess 198. In some embodiments, the rotation causes the projection 190 to slide along a surface of the end portion 196 of the external connector 170 toward a sideface 217 of the end portion 196 that opposes the sideface 216 and that partly defines the recess 198. In other cases, the projection 190 may advance within the recess without contacting the end portion. In some embodiments, the projection 190 contacts the sideface 217 when in the retained position, such that the projection 190 and the sideface 217 operate as a rotational stop for the external connector 170.

Figure 3B:
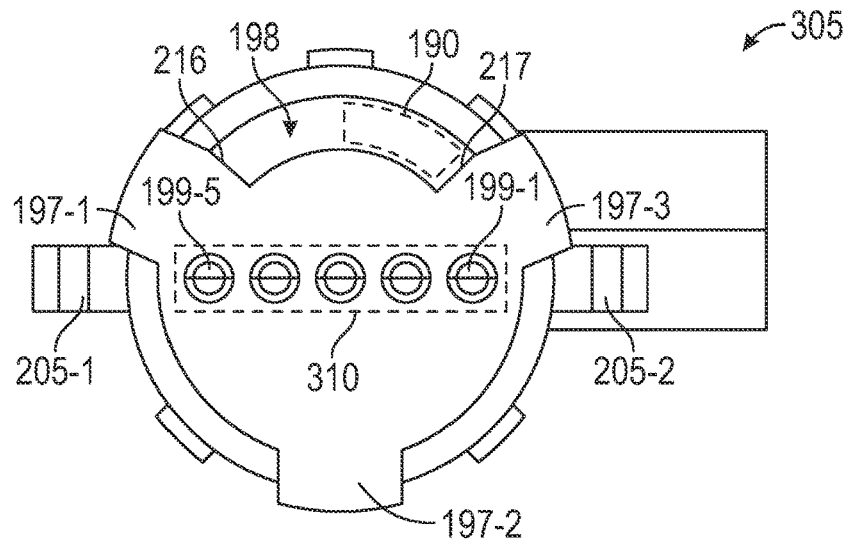
FIG. 3B provides an end view of the external connector in the second rotational position, according to one or more embodiments.
Figure 3C:
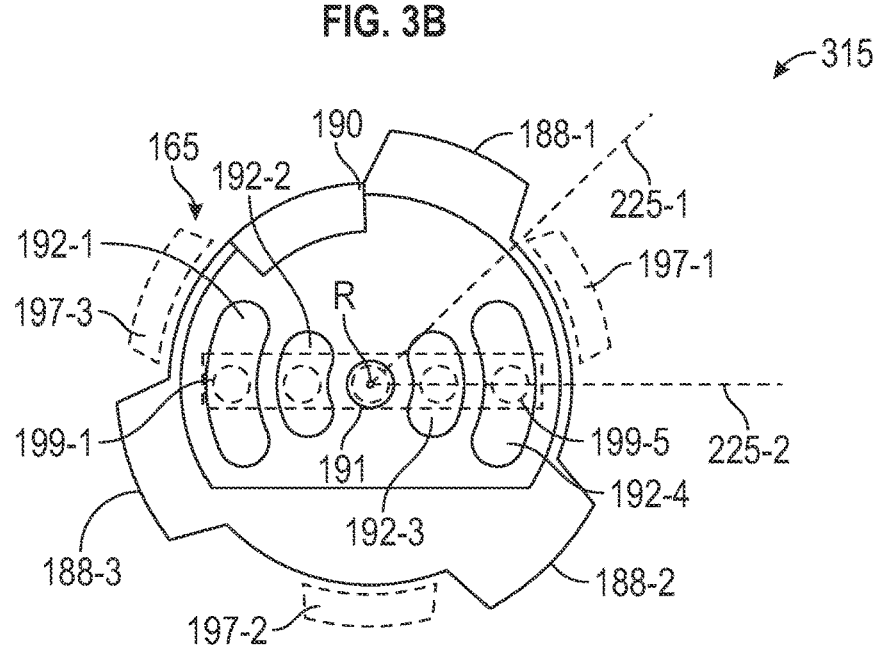
FIG. 3C provides an end view of the connector interface overlaid with portions of the external connector in the second rotational position, according to one or more embodiments.
Figure 3D:
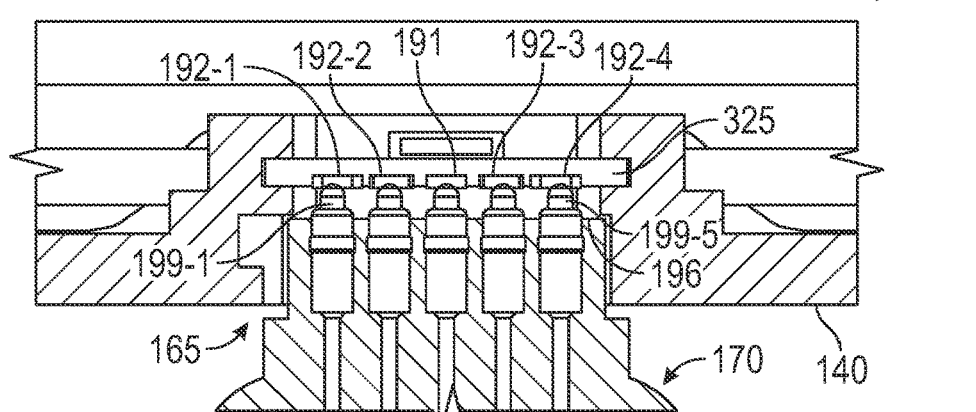
FIG. 3D provides a cross-section view of spring-loaded pins of the external connector connected to the plurality of conductors of the connector interface, according to one or more embodiments.
Figure 4A:
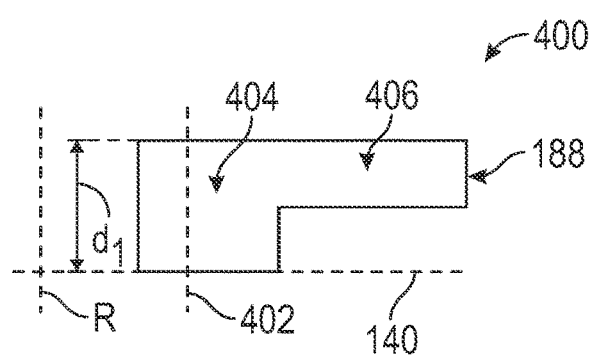
FIGS. 4A-4H provide cross-section diagrams of exemplary implementations of a circumferential slot of the connector interface, according to one or more embodiments.
Figure 4B:
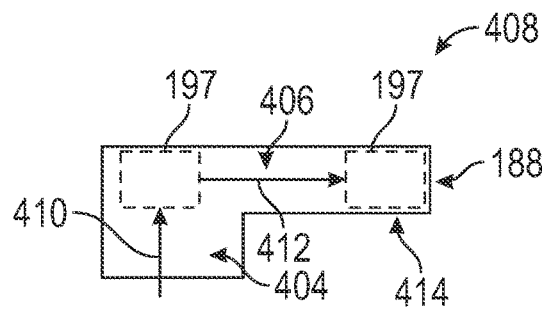
Figure 4C:
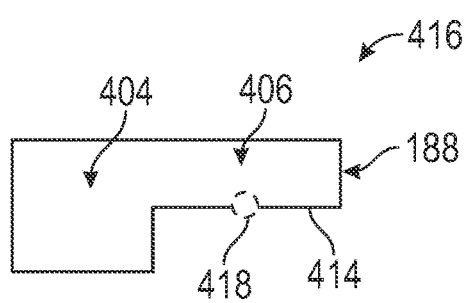
Figure 4D:
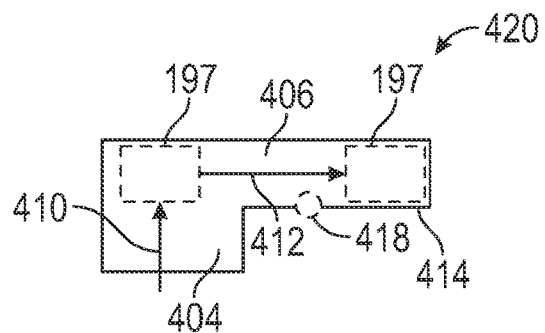
Figure 4E:
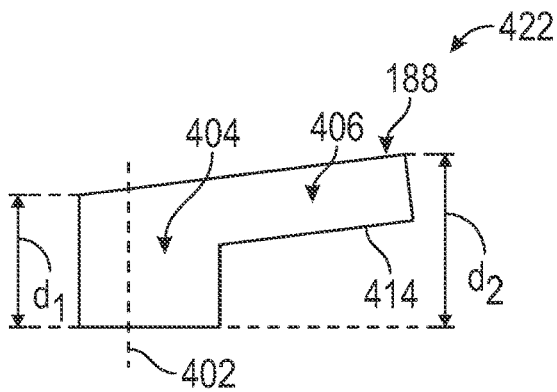
Figure 4F:
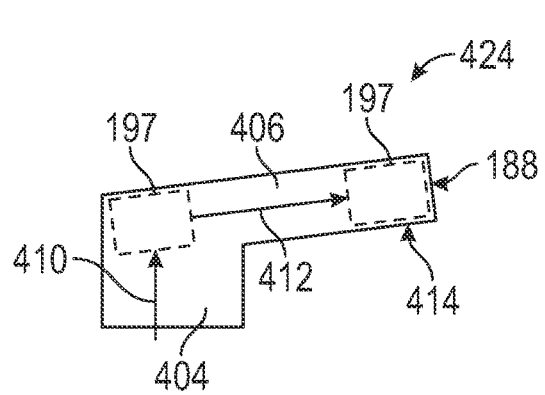
Figure 4G:
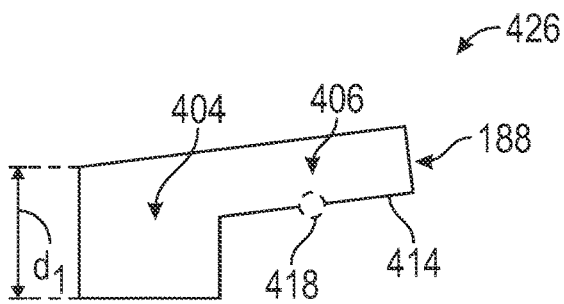
Figure 4H:
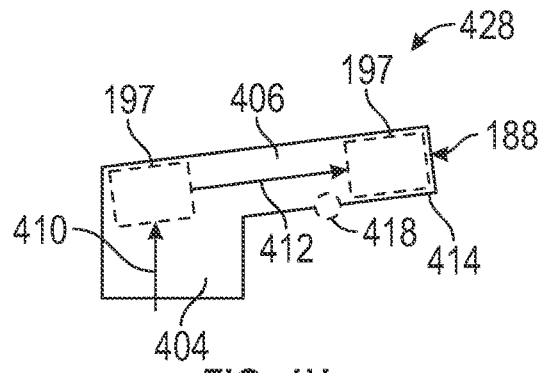

Rotation of the external connector 170 causes the plurality of second conductors 199-1, 199-2, ..., 199-5 to rotate about the axis of rotation R from the orientation 215 to an orientation 310 as shown in end view 305 of FIG. 3B. In the orientation 310, the plurality of second conductors 199-1, 199-2, ..., 199-5 are linearly aligned along the second angle 225-2. The second conductor 199-3 overlaps and remains connected to the central conductor 101, the second conductors 199-2, 199-4 overlap and are connected to the arcuate conductors 192-2, 192-3, and the second conductors 199-1, 199-5 overlap and are connected to the arcuate conductors 192-1, 192-5.

Rotation of the external connector 170 causes a sequenced connection of the plurality of second conductors 199-1, 199-2, ..., 199-5 to the plurality of first conductors 191, 192-1, 192-2, 192-3, 192-4. Using the end view 315 of FIG. 3C as one example, in a first connection state (e.g., following insertion of the external connector 170 into the connector interface 165) the second conductor 199-3 connects to the central conductor 101 and the second conductors 199-2, 199-4 connect to the arcuate conductors 192-2, 192-3, and in a second connection state (e.g., rotation to the retained position) the second conductor 199-3 connects to the central conductor 101, the second conductors 199-2, 199-4 connect to the arcuate conductors 192-2, 192-3, and the second conductors 199-1, 199-5 overlap connect to the arcuate conductors 192-1, 192-5.

Figure 5:
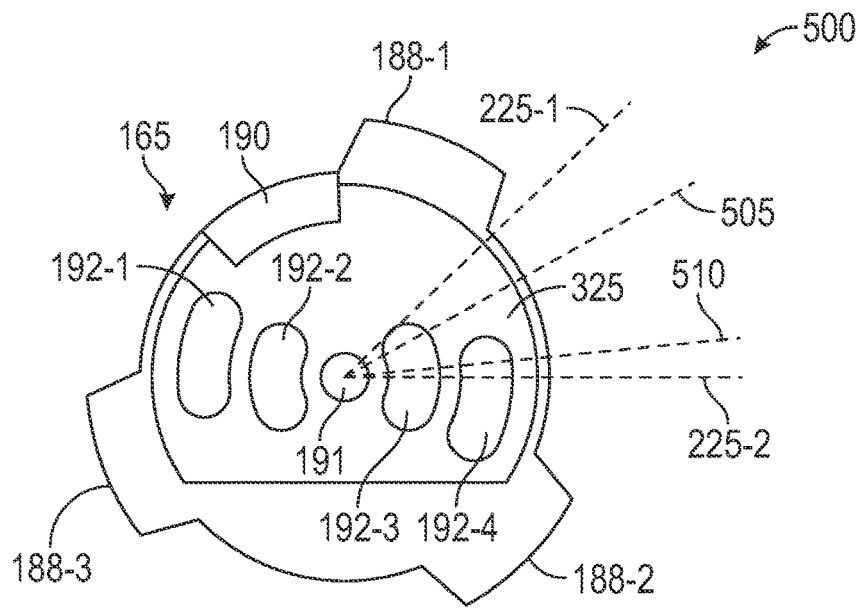
FIG. 5 provides an end view of the connector interface having radially staggered conductors, according to one or more embodiments.

Another example supporting a sequenced connection of the plurality of second conductors 199-1, 199-2, ..., 199-5 to the plurality of first conductors 191, 192-1, 192-2, 192-3, 192-4 is shown as end view 500 of FIG. 5. In the end view 500, some of the arcuate conductors 192-1, 192-2, 192-3, 192-4 are radially staggered. As shown, the plurality of arcuate conductors 192-1, 192-2, 192-3, 192-4 have a same length, which corresponds to a first arc angle measurement for the arcuate conductors 192-2, 192-3, and to a second arc angle measurement for the arcuate conductors 192-1, 192-4 that is smaller than the first arc angle measurement. The arcuate conductors 192-2, 192-3 are aligned with each other, and the arcuate conductors 192-1, 192-4 are aligned with each other and radially staggered from the arcuate conductors 192-2, 192-3.

For example, in a first connection state (e.g., following insertion of the external connector 170 into the connector interface 165) the second conductor 199-3 connects to the central conductor 101, in a second connection state (e.g., rotation to an intermediate rotational angle 505 between the first rotational angle 225-1 and the second rotational angle 225-2) the second conductor 199-3 connects to the central conductor 101 and the second conductors 199-2, 199-4 connect to the arcuate conductors 192-2, 192-3, and in a third connection state (e.g., rotation to another intermediate rotational angle 510 between the first intermediate rotational angle 505 and the second rotational angle 225-2, or rotation to the retained position) the second conductor 199-3 connects to the central conductor 101, the second conductors 199-2, 199-4 connect to the arcuate conductors 192-2, 192-3, and the second conductors 199-1, 199-5 overlap connect to the arcuate conductors 192-1, 192-5.

In some embodiments, the plurality of first conductors 191, 192-1, 192-2, 192-3, 192-4 comprises one or more power conductors and one or more signal conductors. The sequenced connection may connect the corresponding conductors of the plurality of second conductors 199-1, 199-2, ..., 199-5 connect to the one or more power conductors before corresponding conductors of the plurality of second conductors 199-1, 199-2, ..., 199-5 connect to the one or more signal conductors. In one non-limiting example, the central conductor 191, the arcuate conductor 192-2, and/or the arcuate conductor 192-3 may be power conductors that are each connected to a ground or a voltage rail of the electronic device 105, and the arcuate conductors 192-1, 192-4 may be signal conductors. Thus, the electronic device 105 may supply power to an external electronic device (e.g., an external sensor or other device) via the connectorized cable 175 before establishing signal communications with the external electronic device.

FIGS. 4A-4H provide cross-section diagrams 400, 408, 416, 420, 422, 424, 426, 428 of exemplary implementations of a circumferential slot 188 of the connector interface, according to one or more embodiments. The features illustrated in the cross-section diagrams 400, 408, 416, 420, 422, 424, 426, 428 may be used in conjunction with other embodiments discussed herein. For example, each of the circumferential slots 188-1, 188-2, 188-3 in FIGS. 1A, 1B, 2A, 2C, 3A, 3C may be implemented as a respective instance of the circumferential slot 188 formed in a structure of the enclosure 110 (e.g., a sidewall).

In the diagrams 400, 408, the circumferential slot 188 defines a first section 404 that extends along an axis 402 that is parallel to the axis of rotation R of the external connector 170. The first section 404 extends from an external surface (as shown, the bottom surface 140) to a first depth $d_1$. The circumferential slot 188 further defines a second section 406 that extends circumferentially from the first depth $d_1$. In some embodiments, the second section 406 extends along an axis that is parallel to the bottom surface 140 and orthogonal to the axis 402.

In the diagram 408, a flange 197 (e.g., one of the flanges 197-1, 197-2, 197-3) is translated in the first section 404 being inserted along the direction 410. In some cases, the flange 197 contacts the structure at the first depth $d_1$, such that the portion of the structure that defines the first section 404 operates as an insertion stop for the flange 197. The flange 197 is received in the second section 406 being translated along the direction 412 as the external connector 170 is rotated. In some cases, the flange 197 contacts a sideface 414 of the structure at the first depth $d_1$, such that the portion of the structure that defines the sideface 414 operates as a rotational stop for the flange 197.

The diagrams 416, 420 illustrate an embodiment in which a detent 418 is disposed at an end of the second section 406 opposite the first section 404. Generally, the detent 418 engages the flange 197 and requires a threshold amount of rotational force (or torque) to be applied to the external connector 170 to permit the flange 197 to pass from one side of the detent 418 to the other. The detent 418 may have any suitable implementation for retaining the flange 197, such as fixed projection(s) disposed along outer edge(s) of the second section 406, movable or compliant projection(s) disposed along the outer edge(s), and so forth. In some embodiments, the detent 418 is integrally formed with the structure of the enclosure, such as a bump or a finger that deforms or pivots as the flange 197 approaches the sideface 414. In other embodiments, the detent 418 is formed of material(s) other than that of the structure of the enclosure.

The diagrams 422, 424 illustrate an embodiment in which the second section 406 extends along an axis that is non-orthogonal to the axis 402. The second section 406 extends from the first depth $d_1$ to a second depth $d_2$ that is further from the bottom surface 140. In this way, the rotation of the external connector 170 causes the plurality of second conductors 199-1, 199-2, ..., 199-5 to advance in a direction of the axis of rotation R, which may be used to selectively and/or sequentially connect the plurality of second conductors 199-1, 199-2, ..., 199-5 with the plurality of first conductors 191, 192-1, 192-2, 192-3, 192-4 of the connector interface 165. Further, advancing the plurality of second conductors 199-1, 199-2, ..., 199-5 may be used to apply a compressive force between the connection of the plurality of second conductors 199-1, 199-2, ..., 199-5 with the plurality of first conductors 191, 192-1, 192-2, 192-3, 192-4. The diagrams 426, 428 illustrate an embodiment in which the second section 406 extends along the non-orthogonal axis and includes a detent 418 at the end of the second section 406.

Figure 6A:
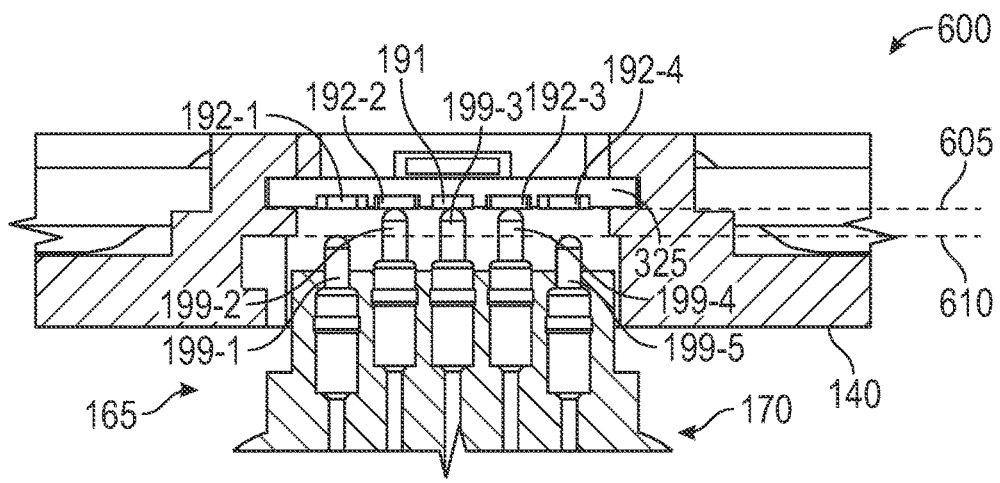
FIGS. 6A and 6B illustrate an exemplary implementation of the external connector with staggered conductors, according to one or more embodiments.
Figure 6B:
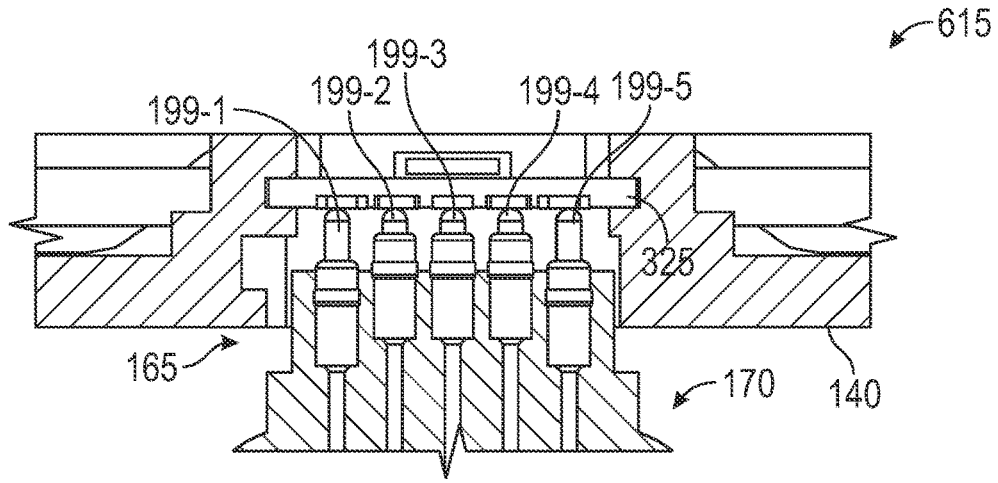

FIGS. 6A and 6B illustrate an exemplary implementation of the external connector 170 with staggered conductors, according to one or more embodiments. The features illustrated in cross-section views 600, 615 may be used in conjunction with other embodiments described herein. In the cross-section view 600, the second conductors 199-2, 199-3, 199-4 have a first extent 605 from the external connector 170, and the second conductors 199-1, 199-5 have a second extent 610 from the external connector 170 that is less than the first extent 605. Although the second conductors 199-1, 199-2, ..., 199-5 are shown with a same dimensioning, alternate implementations may have some of the second conductors 199-1, 199-2, ..., 199-5 with different lengths to provide the staggered disposition.

As the external connector 170 is inserted into the connector interface 165, the second conductors 199-2, 199-3, 199-4 first contact the corresponding first conductors 192-2, 191, 192-3. As the compressive force is applied to the second conductors 199-2, 199-3, 199-4 and the plungers of the spring-loaded pins are displaced, the second conductors 199-1, 199-5 contact the corresponding first conductors 192-1, 192-4 as shown in the cross-section view 615. In this way, the external connector 170 with the staggered conductors also supports a sequenced connection of the plurality of second conductors 199-1, 199-2, ..., 199-5 with the plurality of first conductors 191, 192-1, 192-2, 192-3, 192-4.

Figure 7:
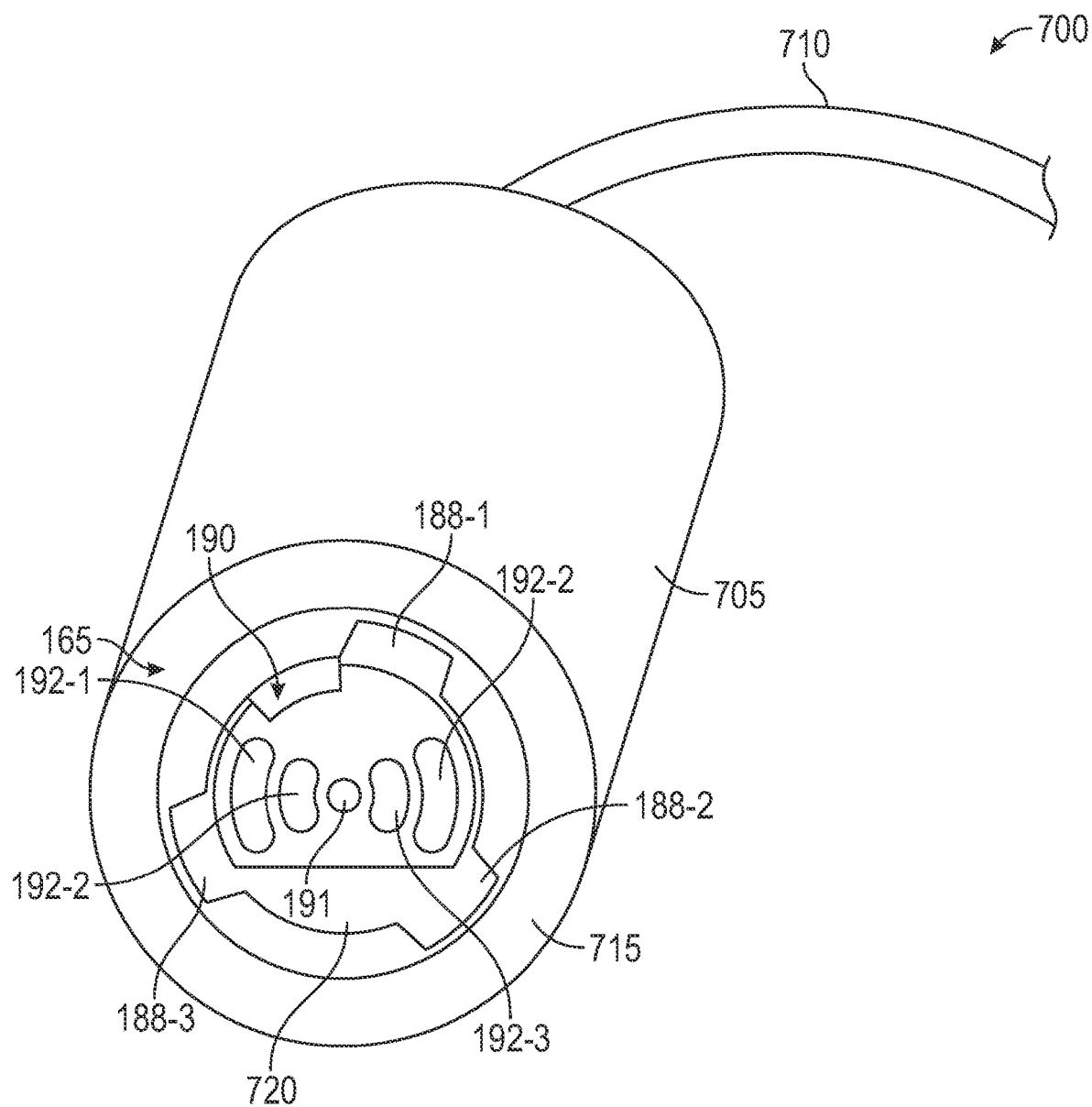
FIG. 7 illustrates an exemplary implementation of a connector interface in a connectorized cable, according to one or more embodiments.

FIG. 7 illustrates an exemplary implementation of the connector interface 165 in a connectorized cable 710, according to one or more embodiments. The features illustrated in the view 700 may be used in conjunction with other embodiments, for example, connecting with the external connector 170 of FIG. 1C using the techniques illustrated in FIGS. 2A, 2B, 2C, 3A, 3B, 3C, 3D In the view 700, a connector body 705 (or "body") is connected to a cable 710. Although the connector body 705 is shown as having a generally cylindrical shape, other suitable contouring of the connector body 705 is also contemplated. The connector body 705 defines a first surface 715 (or "external surface"), which as shown corresponds to a planar endface of the cylindrical shape.

The connector body 705 further defines a recess from the first surface 715, and a second surface 720 that is disposed at the recess and recessed from the first surface 715. The recess has a plurality of circumferential slots 188-1, 188-2, 188-3 that extend into the connector body 705 from the first surface 715.

Figure 8A:
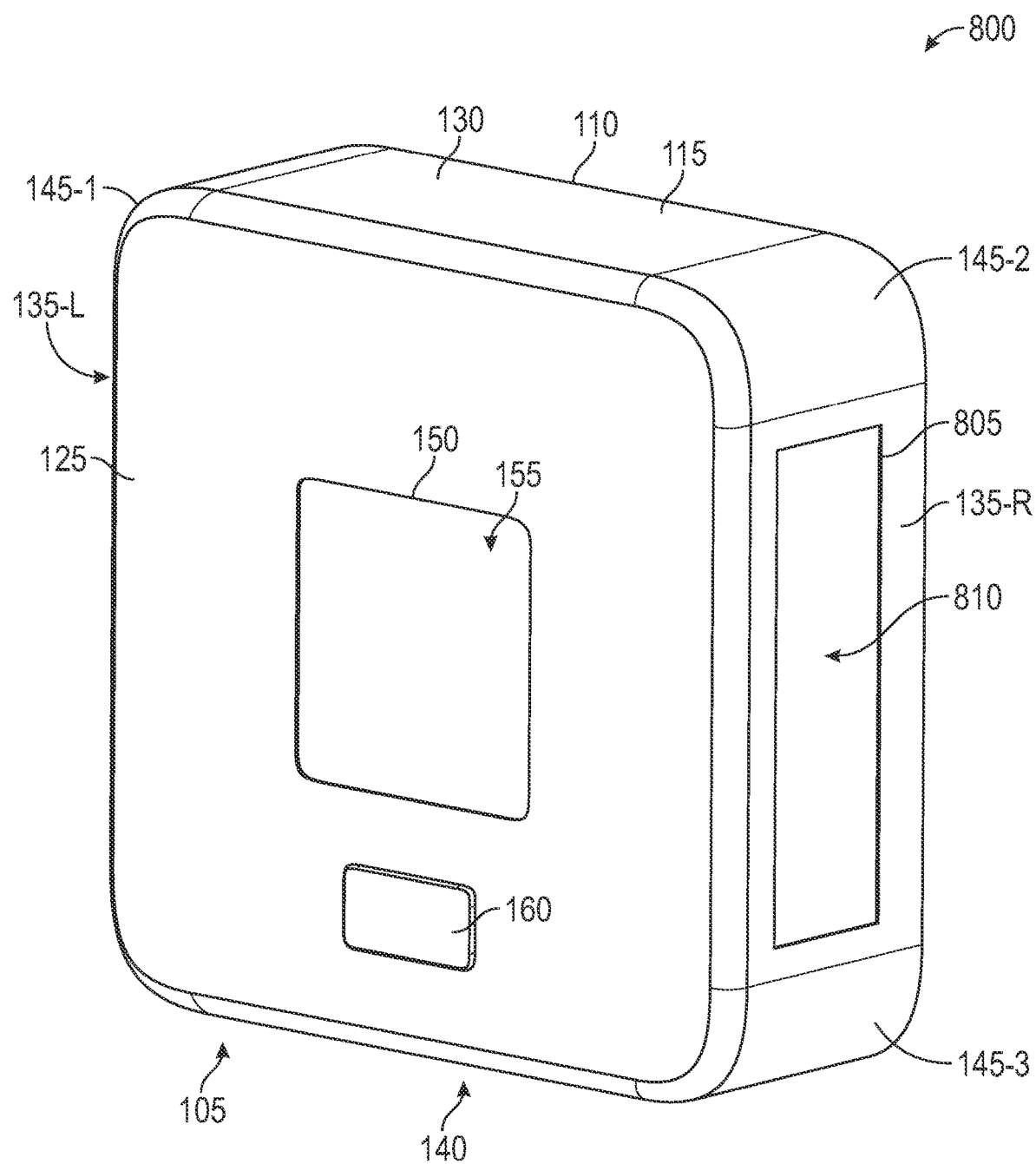
FIGS. 8A and 8B provide perspective views of an exemplary electronic device for monitoring one or more parameters of an ambient environment, according to one or more embodiments.
Figure 8B:
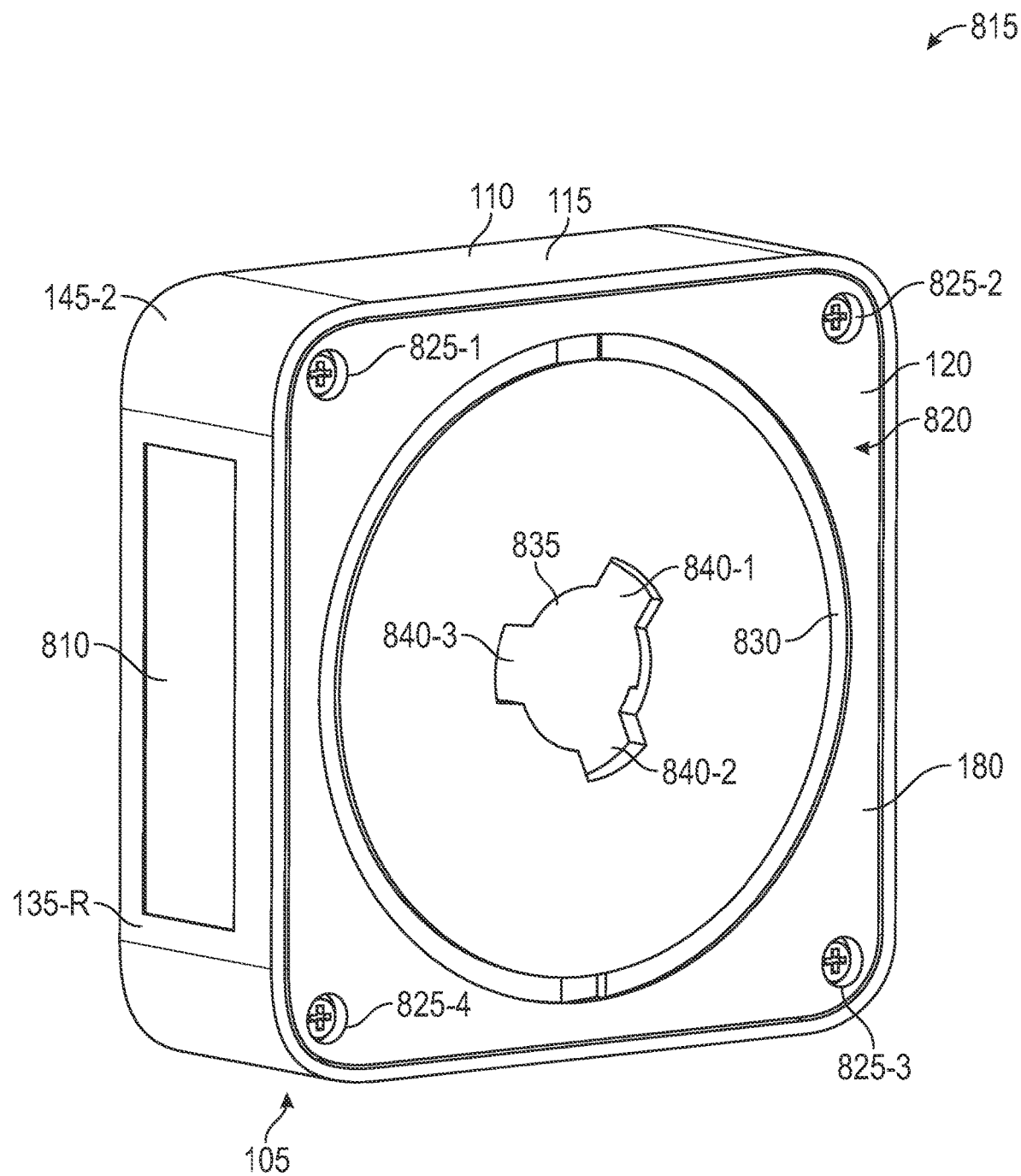

FIGS. 8A and 8B provide perspective views of an exemplary electronic device 105 for monitoring one or more parameters of an ambient environment, according to one or more embodiments. More specifically, FIG. 8A provides a front perspective view 800, and FIG. 8B provides a rear perspective view 815 of the electronic device 105. The features of the views 800, 815 may be used in conjunction with other embodiments described herein.

As shown, the enclosure 110 comprises the first cover member 115 (e.g., a cap) and the second cover member 120 (e.g., a base plate) that are removably attachable with each other, e.g., using threaded fasteners 825-1, 825-2, 825-3, 825-4 that are distributed around a perimeter of the enclosure 110.

In some embodiments, the second cover member 120 comprises an attachment interface 820 at the rear surface 845 of the enclosure 110. In some embodiments, the attachment interface 820 attaches to a wall of a compartment of a vehicle, or to another vertical (or substantially vertical) surface in an environment, which provides the electronic device 105 with the orientation depicted in the views 800, 815 (e.g., corresponding to the descriptors "top", "side", "bottom", "rear"). In some embodiments, the attachment interface 820 attaches directly to the wall. In other embodiments, the attachment interface 820 attaches to a complementary attachment interface that is directly attached to the wall (e.g., a mounting plate that screws into the wall and that includes complementary features that mate with features of the attachment interface 820). The attachment interface 820 may use any suitable attachment techniques that provide a suitable attachment force with the electronic device 105 to reduce the likelihood of dislocation of the electronic device 105 due to intentional or incidental contact. In one non-limiting example, the attachment force is between 15 and 30 Newtons (N), although other values of the attachment force are also contemplated. For example, the attachment interface 820 may include threaded surfaces, grooves, snap fits, tabs, detents, and so forth that engage with complementary features to attach the electronic device 105 to the wall.

In FIG. 8B, the attachment interface 820 defines an annular groove 830 that circumscribes, and is coaxial with, a central recess 835 in the third plane of the rear surface 845. The annular groove 830 and the central recess 835 each extend partly through the second cover member 120 from the rear surface 845. As shown, the central recess 835 defines three (3) circumferential recesses 840-1, 840-2, 840-3. When a user manipulates the electronic device 105 to attach the electronic device 105 to the wall or other surface, a central raised feature of the complementary attachment interface (or wall) is received in the central recess 835, and a circumferential raised feature (annulus or one or more tabs) of the complementary attachment interface (or wall) is received in the annular groove 830. In some embodiments, the electronic device 105 and the attachment interface 820 may be rotated by the user after the raised feature(s) are received in the central recess 835 and/or the annular groove 830. For example, the central raised feature may include a cylinder and circumferential flanges, and the rotation of the attachment interface 820 relative to the central raised feature causes the circumferential flanges to rotate within the circumferential recesses 840-1, 840-2, 840-3 of the central recess 835, which thereby attaches (and retains) the attachment interface 820 to the wall.

The side surface 135-R defines an opening 805 extending through the first cover member 115. As shown, the opening 805 is disposed near a center of the side surface 135-R and is rectangular-shaped. A thermal member 810 is disposed in the opening 805 that provides improved thermal conductivity, when compared with other portions of the enclosure 110, while maintaining the ingress protection of the enclosure 110. The thermal member 810 is thermally contacted to a temperature sensor that is disposed within the internal volume of the enclosure 110. The thermal member 810 improves the thermal responsivity of the electronic device and supports greater sampling rates of the temperature of the ambient environment while maintaining the ingress protection of the enclosure 110. As will be discussed in greater detail below, the thermal member 810 may be formed of any suitable material(s) and may have any dimensioning that provides a suitable thermal conductivity for the temperature sensor, and that provides suitable strength to maintain the ingress protection of the enclosure 110. In some embodiments, the thermal member 810 comprises a metal, such as aluminum or stainless steel.

Figure 9:
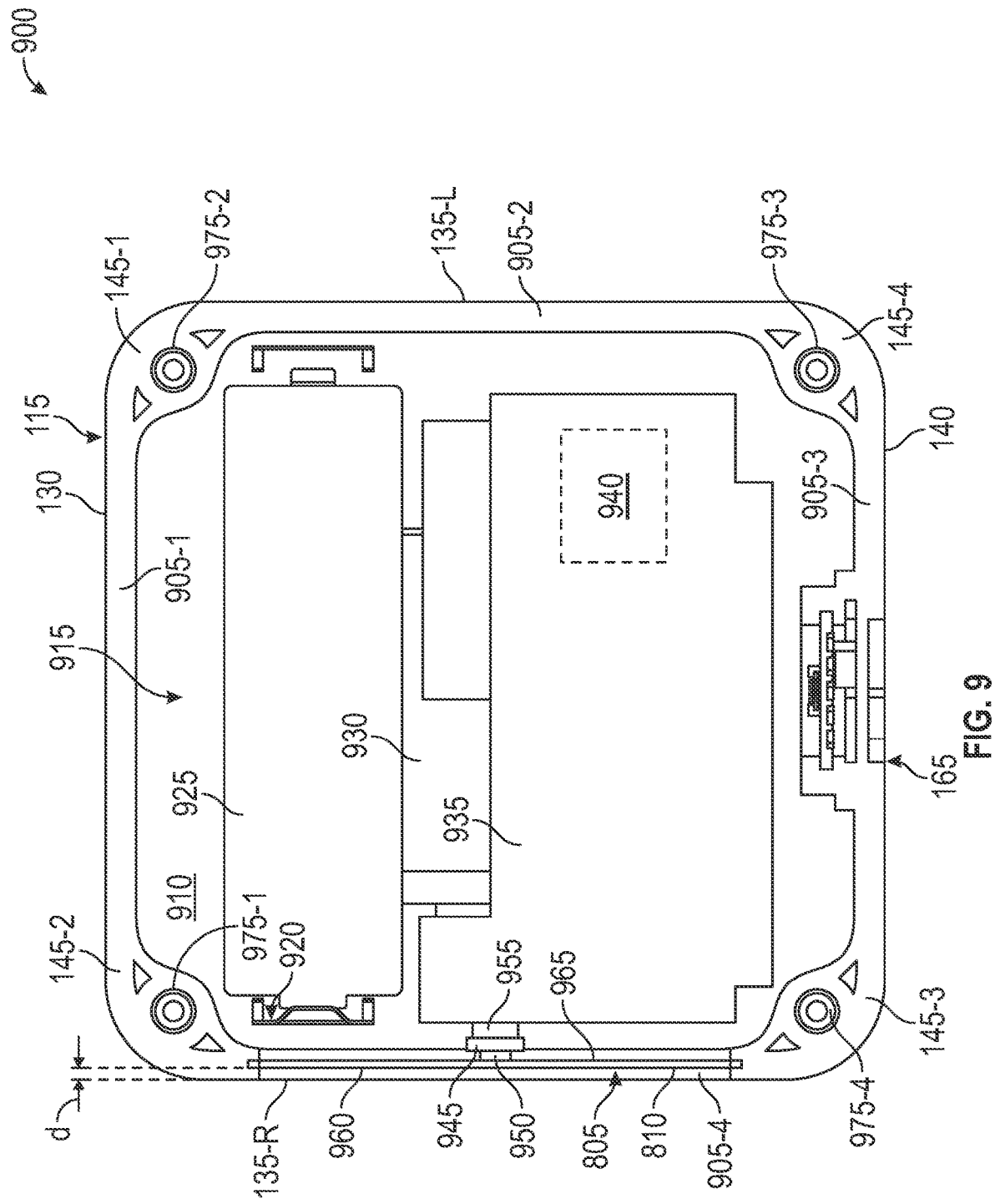
FIG. 9 provides a rear view of a cover member of an exemplary enclosure of the electronic device, according to one or more embodiments.

Refer now to FIG. 9, which provides a rear view 900 of the first cover member 115. The first cover member 115 defines sidewalls 905-1, 905-2, 905-3, 905-4 and an internal surface 910 that is opposite the front surface 125 and that extends to the sidewalls 905-1, 905-2, 905-3, 905-4. The sidewall 905-1 defines the top surface 130, the sidewall 905-2 defines the side surface 135-L, the sidewall 905-3 defines the bottom surface 140, and the sidewall 905-4 defines the side surface 135-R. The sidewalls 905-1, 905-2 extend to the curved corner section 145-1, the sidewalls 905-2, 905-3 extend to the curved corner section 145-4, the sidewalls 905-3, 905-4 extend to the curved corner section 145-3, and the sidewalls 905-1, 905-4 extend to the curved corner section 145-2.

The opening 805 extends through the sidewall 905-4, and a slot (not shown) is formed in the sidewall 905-4 that circumscribes the opening 805. Described another way, the areal extent of the slot and the areal extent of the opening 805 are overlapping with each other, and the areal extent of the slot is greater than the areal extent of the opening 805. The thermal member 810 is disposed in the slot, and the thermal member 810, the sidewalls 905-1, 905-2, 905-3, 905-4, and the curved corner sections 145-1, 145-2, 145-3, 145-4 (along with the second cover member 120 when attached) define an internal volume 915 of the enclosure 110. In some embodiments, the thermal member 810 forms a portion of an external surface of the enclosure 110.

The thermal member 810 defines a first, external surface 960 and a second, internal surface 965 opposite the first external surface 960. The thermal member 810 may have any suitable shape. As shown, the thermal member 810 is rectangular-shaped, although other shapes that are suitable to cover the opening 805 are also contemplated. The first, external surface 960 is in a first plane and the second, internal surface 265 is in a second plane parallel to the first plane. The first plane and the second plane are parallel to a third plane of the side surface 135-R.

The slot may have any suitable disposition relative to the opening 805. As shown, the slot is arranged along a midline of the sidewall 905-4, such that the first, external surface 960 of the thermal member 810 is recessed from the side surface 135-R to a depth d. In other embodiments, the slot may be disposed such that the first, external surface 960 of the thermal member 810 is flush with the side surface 135-R. Stated another way, the external surface 960 and the side surface 135-R in this configuration may form a substantially continuous external surface of the enclosure 110.

The second, internal surface 965 of the thermal member 810 is thermally contacted to a temperature sensor 950 disposed inside the internal volume 915. In some embodiments, the thermal member 810 and the temperature sensor 950 are in direct thermal contact with each other (that is, without material(s) disposed therebetween). In other embodiments, the thermal member 810 and the temperature sensor 950 thermally contact each other through one or more materials, such as a thermally conductive adhesive (epoxy).

The material(s), the dimensions, and the arrangement of the thermal member 810 may be selected to provide a suitable thermal conductivity between the thermal member 810 and the temperature sensor 950. Generally, a greater thermal conductivity supports greater sampling rates of the temperature of the ambient environment. A larger area of the first, external surface 960 and/or the second, internal surface 965 tends to correspond to a greater thermal conductivity. In some embodiments, the surface area of portion of the first, external surface 960 that is exposed at the opening 805 to the ambient environment is greater than 50% of the surface area of the side surface 135-R.

A smaller thickness of the thermal member 810 also tends to correspond to a greater thermal conductivity. In some cases, the thermal member 810 may have, depending on the material(s) selected for the thermal member 810, at least a minimum thickness to provide sufficient structural strength at the sidewall 905-4.

In some embodiments, the thermal member 810 is formed of sheet aluminum, and has a width between 5 and 25 mm, and has a length between 15 and 60 mm. In one non-limiting example, the thermal member 810 is about 10 mm wide, 30 mm long, and about 0.5 mm thick.

In some embodiments, substantially all of the first, external surface 960 of the thermal member 810 is exposed to the ambient environment at the opening 805, and substantially all of the second, internal surface 965 of the thermal member 810 is exposed to the internal volume 915. As discussed herein, "substantially all" refers to percentages of 75% or more of the surface area of the surface. It will further be noted that the percentage of the first, external surface 960 that is exposed may be the same or may be different than the percentage of the second, internal surface 965 that is exposed. Beneficially, exposing substantially all of the first, external surface 960 and of the second, internal surface 965 improves the thermal conductivity between the thermal member 810 and the temperature sensor 950, as the insulative properties of the material of the sidewall 905-4 overlapping the first, external surface 960 and/or the second, internal surface 965 tends to reduce the thermal conductivity between the thermal member 810 and the temperature sensor 950.

The first cover member 115 may be manufactured using any suitable techniques. In some embodiments, the first cover member 115 is formed of an injection-molded plastic that defines the opening 805 and the slot, and the thermal member 810 is later inserted in the slot. In such cases, adhesive or other fastening techniques may be used to attach the thermal member 810 to the sidewall 905-4 at the opening 805. In other embodiments, the injection-molding process occurs around the thermal member 810 such that the sidewall 905-4 is integrally formed with the thermal member 810.

Although the opening 805 and the thermal member 810 are depicted along the side surface 135-R of the sidewall 905-4, alternate implementations of the enclosure 110 may have the opening 805 and/or the thermal member 810 at other locations. However, the side surface 135-R (or alternately, the side surface 135-L) may be beneficial for a number of reasons. For example, placement of the thermal member 810 along the side surface 135-R avoids pooling of water (which is more likely along the top surface 130), and/or provides improved contact with air flow in the ambient environment (e.g., disposed away from the attachment interface 820). The surface area of the side surface 135-R is largely unused by other components (such as the window 155, the input device 160, the attachment interface 820, and so forth) which permits the thermal member 810 to have a larger surface area. In some cases, the thermal member 810 may be disposed along the side surface 135-R to be disposed away from wireless transmitter circuitry to minimize the effect of the thermal member 810 on wireless signal transmissibility.

Some examples of alternate implementations of the enclosure 110 include disposing the thermal member 810 at one of the curved corner sections 145-1, 145-2, 145-3, 145-4, as a projecting tab from an external surface of the first cover member 115, as a metal strip extending around the front surface 125, or embedded or integrated within one of the sidewalls 905-1, 905-2, 905-3, 905-4. Further, although the thermal member 810 has been depicted as being monolithically formed of a metal material, alternate implementations may include metal patterns, and/or combinations of metal(s) or other materials.

The electronic device 105 further comprises an internal power source that disposed in the internal volume 915. The internal power source supplies electrical power to various electronic components of the electronic device 105, which may include components within the internal volume 915 as well as external components electrically connected through a connector interface 165. As shown, the internal power source comprises a removable battery 925 using any suitable energy storage technology, such as alkaline, lithium, lithium-ion, nickel metal hydride, and so forth. The battery 925 is retained by a battery receptacle 920 that is attached to the first cover member 115. The battery receptacle 920 may be mounted on the internal surface 910, e.g., using threaded fasteners, adhesive, and so forth. In some embodiments, the battery 925 is a replaceable battery, whether one-time use or rechargeable. The dimensions of the battery 925 may be standardized (e.g., a "AA" battery) or may have a proprietary form factor. In alternate implementations, the battery 925 may be non-removable and rechargeable. For example, the battery 925 may be recharged through the enclosure 110, e.g., using an inductive charging coil in the internal volume 915.

The electronic device 105 further comprises a display device 930 mounted on the internal surface 910. The display device 930 is disposed in the internal volume 915 behind the window 155 such that the display device 930 is viewable at the front surface 125 of the enclosure 110. The display device 930 may use any suitable display technology, such as liquid-crystal display (LCD), light-emitting diode (LED), organic LED (OLED), and so forth. The display device 930 receives electric power from the battery 925, and is coupled with one or more computer processors disposed in the internal volume 915.

The electronic device 105 further comprises a first printed circuit board assembly (PCBA) 935 disposed in the internal volume 915 and attached to the first cover member 115. One or more electronic components are mounted on the first PCBA 935 that provide functionality of the electronic device 105. In some embodiments, the one or more electronic components comprise computing hardware, such as one or more computer processors, a memory, and so forth. The one or more electronic components receive electric power from the battery 925 and may be interconnected with each other using conductive traces on the first PCBA 935. In some embodiments, the one or more computer processors may include (1) signal processing circuitry for receiving and processing sensor signals, (2) wireless transceiver circuitry to communicate wireless signals with one or more external electronic devices, and/or (3) display driver circuitry to drive display signals to the display device 930.

As shown, the first PCBA 935 comprises wireless transmitter circuitry 940 to transmit wireless signals to the one or more external electronic devices. In some embodiments, the wireless signals include information representative of measurements of one or more parameters of the ambient environment (e.g., from acquired sensor signals). In some embodiments, the wireless transmitter circuitry 940 is included in wireless transceiver circuitry, which may be included in the one or more computer processors.

In some embodiments, a second PCBA 945 is disposed in the internal volume 915 and is attached to the first cover member 115. In some embodiments, the temperature sensor 950 is mounted to the second PCBA 945 and is thermally connected to the second, internal surface 965 of the thermal member 810. For example, the temperature sensor 950 may be adhered to the thermal member 810 using a thermally conductive epoxy, such that the second PCBA 945 is in a fixed arrangement with the thermal member 810 and the first cover member 115.

The first PCBA 935 and the second PCBA 945 are connected with each other, such that sensor signals from the temperature sensor 950 may be communicated to the one or more computer processors of the first PCBA 935. The connections may further support communication of power and/or signals from the one or more computer processors to the temperature sensor 950 (e.g., control signals). In some embodiments, the first PCBA 935 and the second PCBA 945 are connected by a flexible PCB 955. In other embodiments, the first PCBA 935 and the second PCBA 945 are connected by cabling having one or more conductors, such as a ribbon cable.

In some embodiments, the first PCBA 935 and the second PCBA 945 are connected at a first end of the first PCBA 935 nearest the side surface 135-R of the enclosure 110, and the wireless transmitter circuitry 940 is disposed near a second end of the first PCBA 935 opposite the first end. Beneficially, by arranging the second PCBA 945 (with the temperature sensor 950) near the side surface 135-R and away from the wireless transmitter circuitry 940, the effect of the thermal member 810 on the wireless signal transmissibility is minimized. Described another way, the wireless transmitter circuitry 940 may be positioned within the enclosure 110 such that wireless signals are propagated primarily through portions of the enclosure 110 having greater wireless signal transmissibility (e.g., the antenna radiation patterns of the wireless transmitter circuitry 940 have minimal overlap with metal components of the enclosure 110, such as the thermal member 810).

In some embodiments, posts 975-1, 975-2, 975-3, 975-4 are arranged at the curved corner sections 145-1, 145-2, 145-3, 145-4. Each of the posts 975-1, 975-2, 975-3, 975-4 includes internal threads that engage with external threads of the threaded fasteners 825-1, 825-2, 825-3, 825-4 to secure the second cover member 120 to the first cover member 115. As discussed above, the second cover member 120 removably attaches to the first cover member 115 (using the threaded fasteners 825-1, 825-2, 825-3, 825-4 and the posts 975-1, 975-2, 975-3, 975-4) to form a sealed interface that seals the internal volume 915 from the ambient environment.

Figure 10:
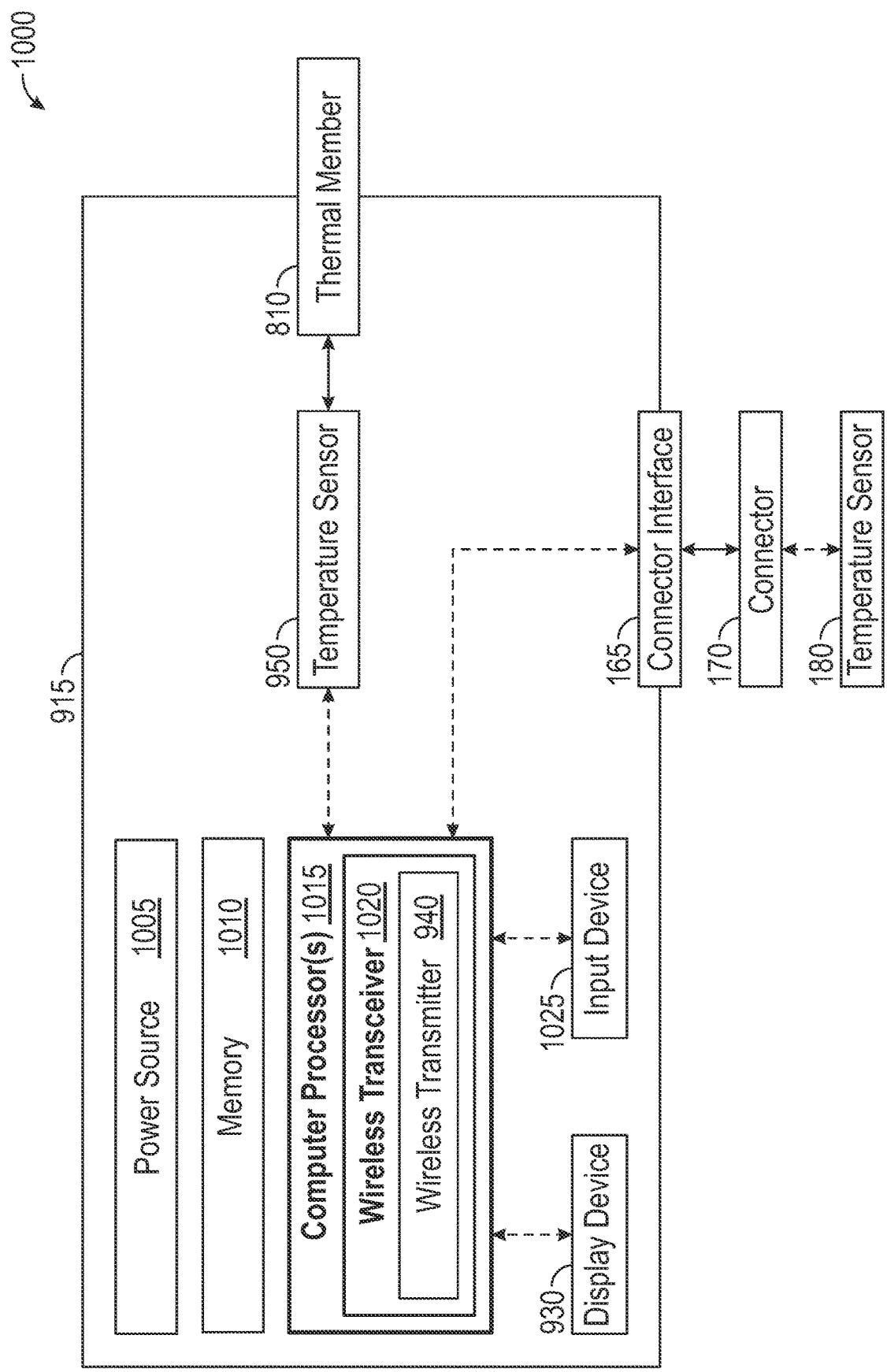
FIG. 10 illustrates a block diagram of an exemplary system for monitoring an environment, according to one or more embodiments.

FIG. 10 illustrates a block diagram of an exemplary system 1000 for monitoring an environment, according to one or more embodiments. The features illustrated in FIG. 10 may be used in conjunction with other embodiments described herein, such as with the electronic device 105. The system 1000 comprises a power source 1005 (such as the battery 925 described above), a memory 1010, one or more computer processors 1015, the display device 930, an input device 1025 (such as the input device 160 described above), and the temperature sensor 950 disposed within the internal volume 915 of the electronic device 105. The thermal member 810 and the connector interface 165 contact the internal volume 915 as well as the ambient environment of the electronic device.

The memory 1010 may include a variety of computer-readable media selected for relative performance or other capabilities: volatile and/or non-volatile media, removable and/or non-removable media, etc. The memory 1010 may include cache, random access memory (RAM), storage, etc. Storage included in the memory 1010 typically provides a non-volatile memory for the electronic device 105, and may include one or more different storage elements such as Flash memory, a hard disk drive, a solid state drive, an optical storage device, and/or a magnetic storage device.

The one or more computer processors 1015 generally include any processing element(s) capable of performing various functions described herein. Some non-limiting examples of the one or more computer processors 1015 include a microprocessor, a digital signal processor (DSP), an application-specific integrated chip (ASIC), and a field programmable gate array (FPGA). While depicted as a single element within the electronic device 105, the one or more computer processors 1015 contemplates a single processor, multiple processors, a processor or processors having multiple cores, as well as combinations thereof. In one embodiment, the one or more computer processors 1015 represents a central processing unit (CPU) of the electronic device 105.

The one or more computer processors 1015 comprise wireless transceiver circuitry 1020, which comprises wireless transmitter circuitry 940 and wireless receiver circuitry (not shown). In some alternate implementations, the wireless transceiver circuitry 1020 and/or the wireless transmitter circuitry 940 may be implemented separately from the one or more computer processors 1015.

The temperature sensor 950 may have any suitable implementation, such as a thermocouple, a resistance temperature detector (RTD), a thermistor, and so forth. In some embodiments, and as discussed above, the temperature sensor 950 may be mounted to the second PCBA 945 in the internal volume 915. The input device 1025 may use any suitable input sensing technology (e.g., resistive, capacitive, inductive, optical).

In some embodiments, the one or more computer processors 1015 may further include signal processing circuitry for receiving and processing sensor signals from the temperature sensor 950, the temperature sensor 180, and/or any other sensors of the electronic device 105. The one or more computer processors 1015 may further include display driver circuitry to drive display signals to the display device 930. In other embodiments, some or all of the functionality of the signal processing circuitry and/or the display driver circuitry may be implemented in computer-readable code that is stored in the memory 1010 and executed by the one or more computer processors 1015. In this way, various aspects of the present disclosure may take the form of entirely hardware embodiments, entirely software embodiments (which includes firmware, resident software, microcode, etc.) or embodiments combining software and hardware aspects that may all generally be referred to herein as a "circuit," "module" or "system."

Figure 11:
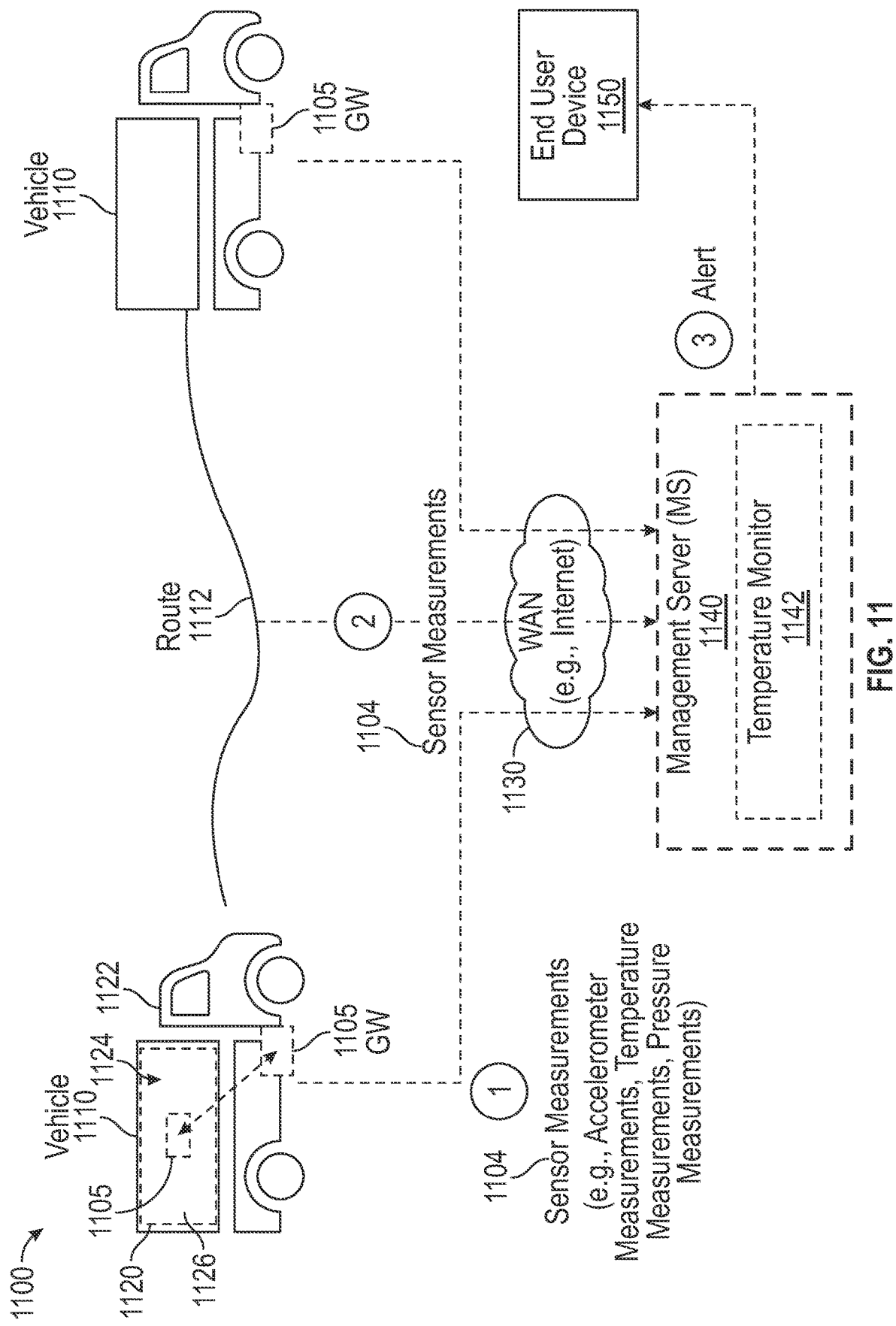
FIG. 11 illustrates a block diagram of the exemplary system for monitoring an environment of a vehicle, according to one or more embodiments.

FIG. 11 illustrates a block diagram of an exemplary system 1100 for monitoring an environment of a vehicle, according to one or more embodiments. The features illustrated in FIG. 11 may be used in conjunction with other embodiments described herein, such as with various embodiments of the electronic device 105.

The system 1100 includes a vehicle 1110 and an optional management server 1140. In some embodiments, the vehicle 1110 is implemented as a tractor coupled with a trailer part of a fleet used for transportation of goods. For example, the vehicle 1110 may be implemented as a tractor, a tow truck, a semi-truck, a light or heavy truck, or any other type of vehicle that is operative to be coupled with and pull a trailer. The vehicle 1110 may alternately be implemented as a car, a van, a bus, a specialized vehicle, a bicycle, a motorized bike, or any other type of vehicle used for transportation of goods or persons without departing from the scope of the present invention. The vehicle 1110 departs from a first location and moves along a route 1112 toward a destination. In some embodiments, the vehicle 1110 can be part of a fleet of vehicles that is operated by a fleet manager. In some embodiments, the fleet of vehicles is managed through the management server 1140. In other embodiments, the vehicle 1110 is a stand-alone vehicle and is not part of a fleet.

The vehicle 1110 defines one or more compartments, which may include one or more passenger compartments, one or more cargo compartments, and/or combinations thereof. Environmental parameters of the one or more compartments may be individually or collectively controlled (e.g., air-conditioned, refrigerated, heated, humidified, dehumidified, illuminated, darkened, ventilated, pressurized, and so forth) to provide a suitable environment for the passenger(s) and/or cargo being transported by the vehicle 1110. In some embodiments, one or more electronic devices 105 are deployed in one or more compartments of the vehicle 1110 to monitor the environmental parameters.

In FIG. 11, the vehicle 1110 is depicted as a box truck having a cab 1122 defining a passenger compartment of the vehicle 1110, and a cargo box 1120 attached to the cab 1122 and defining a cargo compartment 1124 of the vehicle 1110. An electronic device 105 is mounted to a wall 1126 of the cargo box 1120, or to another vertical or substantially vertical surface within the cargo compartment 1124, such as a divider or cabinet.

The electronic device 105 operates to monitor the ambient environment of the cargo compartment 1124. For example, the cargo compartment 1124 may be refrigerated to transport heat-sensitive cargo, and the electronic device 105 monitors a temperature of the cargo compartment 1124 in one or more locations. The electronic device 105 acquires sensor measurements 1104, e.g., temperature measurements using the internal temperature sensor 250 and/or the external temperature sensor 180, and wirelessly transmits signals representative of the sensor measurements 1104 to one or more external electronic devices of the vehicle 1110.

The one or more external electronic devices of the vehicle 1110 include a gateway device 1105 and/or a computing device of the vehicle 1110 (not shown). In some embodiments, the vehicle 1110 includes a computing device with which the vehicle 1110 was manufactured. The computing device is an electronic device that is integrated to the vehicle 1110 and is accessible by aftermarket components through one or more communication interfaces.

In some embodiments, the vehicle 1110 includes the gateway device 1105. In other embodiments, the gateway device 1105 may be optional. The gateway device 1105 may be located at any suitable location inside the vehicle 1110 or outside of the vehicle 1110. In some embodiments, the gateway device 1105 and the electronic device 105 are disposed in a cargo compartment 1124 of the vehicle 1110.

The gateway device 1105 is an electronic device that is operative to connect with a management server 1140 through a Wide Area Network (WAN) 1130. The connection of the gateway device 1105 to the WAN 1130 is a wireless connection (e.g., Wi-Fi, cellular connection, etc.). In some embodiments, the gateway device 1105 and the management server 1140 may be subject to an intermittent connectivity with the WAN 1130. The gateway device 1105 is operative to record or obtain data related to the vehicle 1110 on which it is mounted and transmit the data to the management server 1140. In some embodiments, the gateway device 1105 is further operative to connect to the computing device of the vehicle 1110. For example, the gateway device 1105 may be connected to the computing device of the vehicle 1110 through an On-Board Diagnostics (OBD) port of the vehicle 1110. The gateway device 1105 can obtain data pertaining to events that occur in the vehicle 1110 (e.g., data related to components of the vehicle 1110, such as the engine, and/or data originating from sensors located within the vehicle 1110). The gateway device 1105 is also operative to be coupled with one or more aftermarket devices of the vehicle 1110 (i.e., devices that are not installed by the manufacturer of the vehicle 1110) that are external to the gateway device 1105. These aftermarket devices can include sensors, cameras, etc. that are operative to record and transmit data to the gateway device 1105 through wired or wireless connection (s). The gateway device 1105 is further operative to receive the sensor measurements 1104 (or data representative thereof) from the electronic device 105. Further details of the gateway device 1105 are discussed below with respect to FIG. 14.

In some embodiments, the management server 1140 is a cloud-based server operative to receive data from one or more gateway devices (e.g., the gateway device 1105). Further details of the management server 1140 are discussed below with respect to FIG. 12. In some embodiments, the management server 1140 includes a temperature monitor 1142. In some embodiments, the management server 1140 is optional and the temperature monitor 1142 can be implemented in the gateway device 1105 or in the computing device of the vehicle 1110. Further, consistent with the discussion above, the management server 1140, the gateway device 1105, and/or the computing device of the vehicle 1110 may include one or more other monitors that are operable to monitor one or more other environmental parameters corresponding to measurements acquired by sensors of the electronic device 105.

The temperature monitor 1142 receives temperature measurements of the sensor measurements 1104. In some embodiments, the temperature measurements are received by the gateway device 1105 from the electronic device 105. In some embodiments, the temperature measurements are received by the computing device of the vehicle 1110. In some embodiments, the temperature measurements are received by the management server 1140 from the gateway device 1105.

The temperature measurements are used by the temperature monitor 1142 to determine whether temperature parameters are being maintained in one or more compartments of the vehicle 1110 (e.g., the cargo compartment 1124). In some embodiments, the determination operation is performed automatically without requiring intervention or other input by a user (e.g., a driver or passenger of the vehicle 1110, an associate at an origin or a destination of the vehicle 1110, a vendor or a customer of the cargo, and so forth) that is assessing the environmental parameters of the cargo compartment 1124. Further, the determination is performed based on the sensor measurements 1104 that are acquired during use (e.g., during motive operation) of the vehicle 1110.

In some embodiments, the system 1100 further includes an end user device 1150. The end user device 1150 is a computing device having any suitable configuration (e.g., laptop, workstation, smartphone, palm top, mobile phone, tablet, wearable device, etc.) that is capable of accessing network resources. For example, the end user device 1150 may include software such as a web browser or web application that is capable of accessing the network resources (e.g., HTTP client, FTP client, SSH client, Telnet client, etc.). A user of the end user device 1150 can connect to the management server 1140 to access data about the environmental parameters of the vehicle 1110.

In some embodiments, the user of the end user device 1150 accesses a fleet management service that is provided through the management server 1140 to monitor and track the vehicle 1110 and one or more other vehicles. In some cases, the user of the end user device 1150 is an owner of the vehicle 1110 and/or the gateway device 1105. In some cases, the user is an administrator of the vehicle 1110 and the gateway device 1105. In other cases, the user is a customer of a delivery service that owns the fleet including the vehicle 1110. In other cases, the user is a driver of the vehicle 1110. The end user device 1150 is operative to receive one or more alerts related to the environmental parameters of the vehicle 1110. An alert can include an indication that one or more environmental parameters is out of a predefined range of values.

Each of the electronic device 105, the gateway device 1105, the end user device 1150, and the management server 1140 is implemented as an electronic device. As described herein, an electronic device stores and transmits (internally and/or with other electronic devices over a network) code (which comprises software instructions and which is sometimes referred to as "computer program code" or a "computer program") and/or data using machine-readable media (also called computer-readable media), such as machine-readable storage media (e.g., magnetic disks, optical disks, read only memory (ROM), flash memory devices, phase change memory) and machine-readable transmission media (also referred to as a "carrier") (e.g., electrical, optical, radio, acoustical or other form of propagated signals—such as carrier waves, infrared signals, and so forth). Thus, an electronic device (e.g., a computer) includes hardware and software, such as a set of one or more computer processors coupled to one or more machine-readable storage media to store code for execution on the set of one or more computer processors and/or to store data. For instance, an electronic device may include non-volatile memory storing the code, as the non-volatile memory persists the code even when the electronic device is unpowered (e.g., turned off), and while the electronic device is powered (e.g., turned on) that portion of the code that is to be executed by the computer processor(s) is copied from the slower, non-volatile memory into the faster, volatile memory (e.g., dynamic random access memory (DRAM), static random access memory (SRAM), and so forth) of the electronic device. Typical electronic devices also include a set or one or more physical network interface(s) to establish network connections (to transmit and/or receive code and/or data using propagating signals) with other electronic devices. One or more portions of an embodiment of the invention may be implemented using different combinations of software, firmware, and/or hardware.

Figure 12:
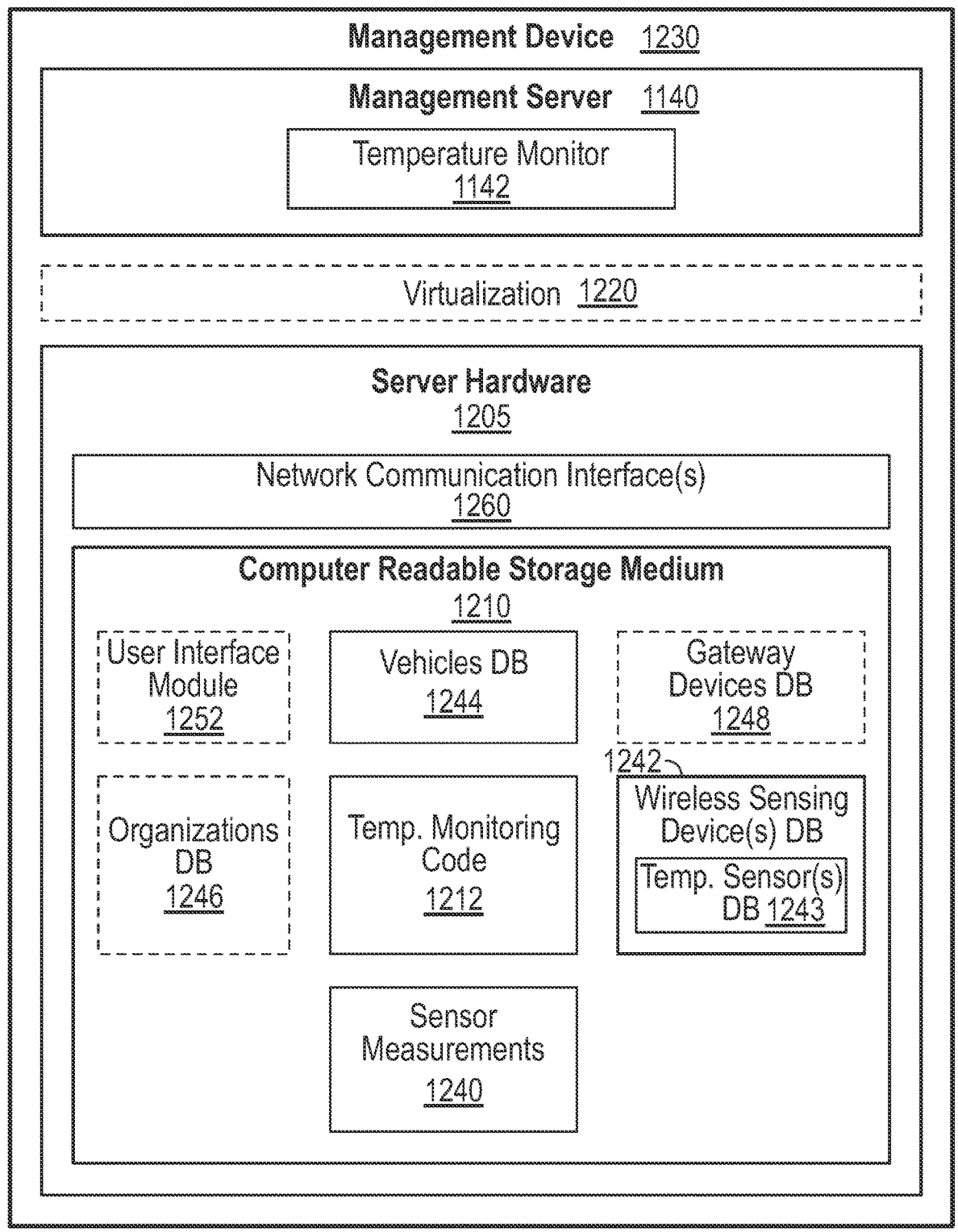
FIG. 12 illustrates a block diagram of an exemplary management device, according to one or more embodiments.

FIG. 12 illustrates a block diagram 1200 of an exemplary management device 1230, according to one or more embodiments. The features illustrated in FIG. 12 may be used in conjunction with other embodiments described herein, such as with various embodiments of the electronic device 105.

The management server 1140 may implemented as a Web or cloud server, or a cluster of servers running on server hardware 1205. In one embodiment, the management server 1140 works for both single and multi-tenant installations, meaning that multiple organizations with different administrators may have electronic devices 105 and/or gateway devices 1105 that are managed by the same management server 1140.

According to one embodiment, the management server 1140 is implemented on a management device 1230 that includes the server hardware 1205. The server hardware 1205 includes one or more network communication interfaces 1260 coupled with a computer-readable storage medium 1210. The computer-readable storage medium 1210 includes temperature monitoring code 1212. The computer-readable storage medium 1210 includes sensor measurements 1240 (e.g., including temperature measurements, accelerometer measurements, pressure measurements, and so forth), a wireless sensing device(s) database 1242 (e.g., including information regarding temperature sensors as a temperature sensors database 1243, accelerometers, or other sensing devices), a vehicles database 1244 (e.g., including information regarding the vehicles 1110, such as information regarding the environmental parameters of the vehicles 1110), an optional organizations database 1246 (e.g., including information regarding the organizations to which the gateway devices 1105, or the vehicles 1110 belong), an optional gateway devices database 348 (e.g., including information regarding the gateway devices 1105), and a user interface module 1252.

While some embodiments of the management device 1230 do not implement virtualization, other embodiments may use different forms of virtualization—represented by a virtualization layer 1220. In these embodiments, the management server 1140 and the portion of the server hardware 1205 that executes the management server 1140 form a virtual management server, which is a software instance of the modules stored on the computer readable storage medium 1210.

Figure 13:
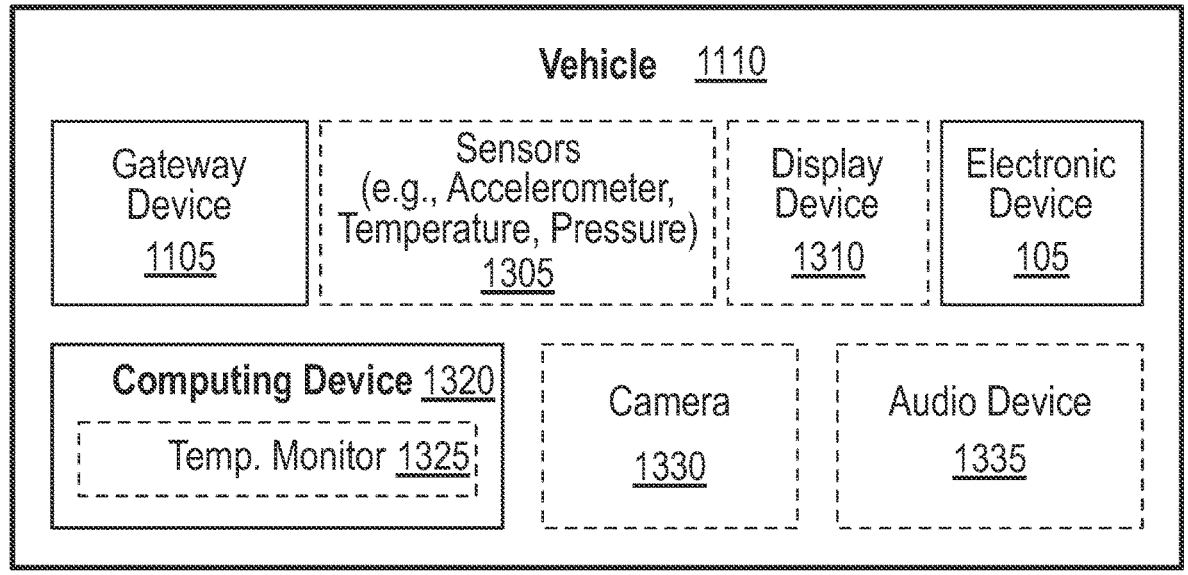
FIG. 13 illustrates a block diagram of an exemplary vehicle, according to one or more embodiments.

FIG. 13 illustrates a block diagram 1300 of an exemplary vehicle 1110, according to one or more embodiments. The features illustrated in FIG. 13 may be used in conjunction with other embodiments described herein, such as with various embodiments of the electronic device 105.

The vehicle 1110 includes a computing device 1320, which in some embodiments is an electronic device that installed by the manufacturer of the vehicle 1110. The computing device 1320 may include a temperature monitor 1325. The temperature monitor 1325 is operative to perform various operations to monitor temperature of one or more compartments of the vehicle 1110. The vehicle 1110 may include one or more sensors 1305 that can be installed by the manufacturer of the vehicle 1110 or aftermarket. The sensors 1305 are electronic devices operative to record and transmit data through the gateway device 1105 towards the management server 1140. The vehicle 1110 may further include a camera 1330, a display device 1310, and an audio device 1335. The display device 1310 and the audio device 1335 can be used to present alerts to a driver or passenger of the vehicle 1110. In some embodiments, the vehicle 1110 includes the electronic device 105, which may be implemented as described above.

Figure 14:
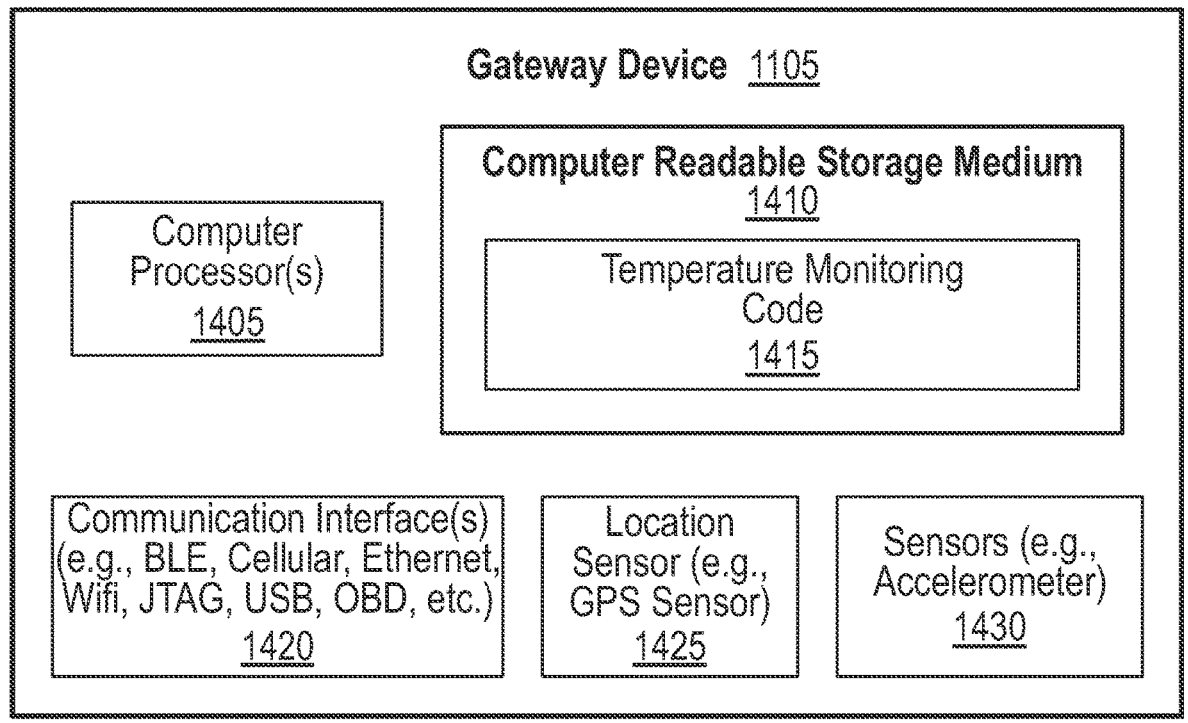
FIG. 14 illustrates a block diagram of an exemplary gateway device, according to one or more embodiments.

FIG. 14 illustrates a block diagram 1400 of an exemplary gateway device 1105, according to one or more embodiments. The features illustrated in FIG. 14 may be used in conjunction with other embodiments described herein, such as with various embodiments of the electronic device 105.

The gateway device 1105 includes one or more computer processors 1405 and connected system components (e.g., multiple connected chips). The gateway device 1105 includes computer-readable storage medium 1410, which is connected to the one or more computer processors 1405. The computer-readable storage medium 1410 may be used for storing data, metadata, and programs for execution by the one or more computer processors 1405. For example, the depicted computer-readable storage medium 1410 may store temperature monitoring code 1415 that, when executed by the one or more computer processors 1405, causes the gateway device 1105 to perform operations as discussed above. In some embodiments, the computer-readable storage medium 1410 may store code, that when executed by the one or more computer processors 1405, causes the gateway device 1105 to receive sensor measurements from the electronic device 105 and/or the computing device of the vehicle 1110 and transmit the data to the management server 1140. The gateway device 1105 may further receive data from the management server 1140 and is operative to configure the electronic device 105.

The gateway device 1105 also includes one or more sensors used to record sensor measurements in response to physical events. For example, the gateway device 1105 may include a location sensor (such as a GPS sensor) 1425 for recording location measurements to indicate the location of the vehicle 1110 on which the gateway device 1105 is mounted. The gateway device 1105 may include one or more other sensors 1430 (e.g., an accelerometer, a temperature sensor, a pressure sensor, etc.).

The devices installed by the manufacturer of the vehicle 1110 can be connected with the computing device of the vehicle 1110 through a wired or a wireless connection to transmit data. In some embodiments, the gateway device 1105 may obtain data based on sensor measurements or image data generated by these devices through the computing device of the vehicle 1110 (e.g., through an on-board diagnostics (OBD) port by which the gateway device 1105 is coupled to the computing device of the vehicle 1110). In other embodiments, the gateway device 1105 may be operative to communicate directly with the devices.

The gateway device 1105 also includes one or more communication interfaces 1420, which are provided to allow a user to provide input to, receive output from, and otherwise transfer data to and from the system. Exemplary input/output devices and communication interfaces 1206 include wired and wireless transceivers, such as a Joint Test Action Group (JTAG) transceiver, a Bluetooth Low Energy (LE) transceiver, an IEEE 802.11 transceiver, an infrared transceiver, a wireless cellular telephony transceiver (e.g., 2G, 3G, 4G, 5G), or another wireless protocol to connect the gateway device 1105 with another device, external component, or a network, and to receive stored instructions, data, tokens, etc. It will be appreciated that one or more buses may be used to interconnect the various components shown in FIG. 14.

It will be appreciated that additional components, not shown, may also be included in the gateway device 1105, and in certain embodiments, fewer components than that shown in FIG. 14 may also be used in the gateway device 1105.

Figure 15:
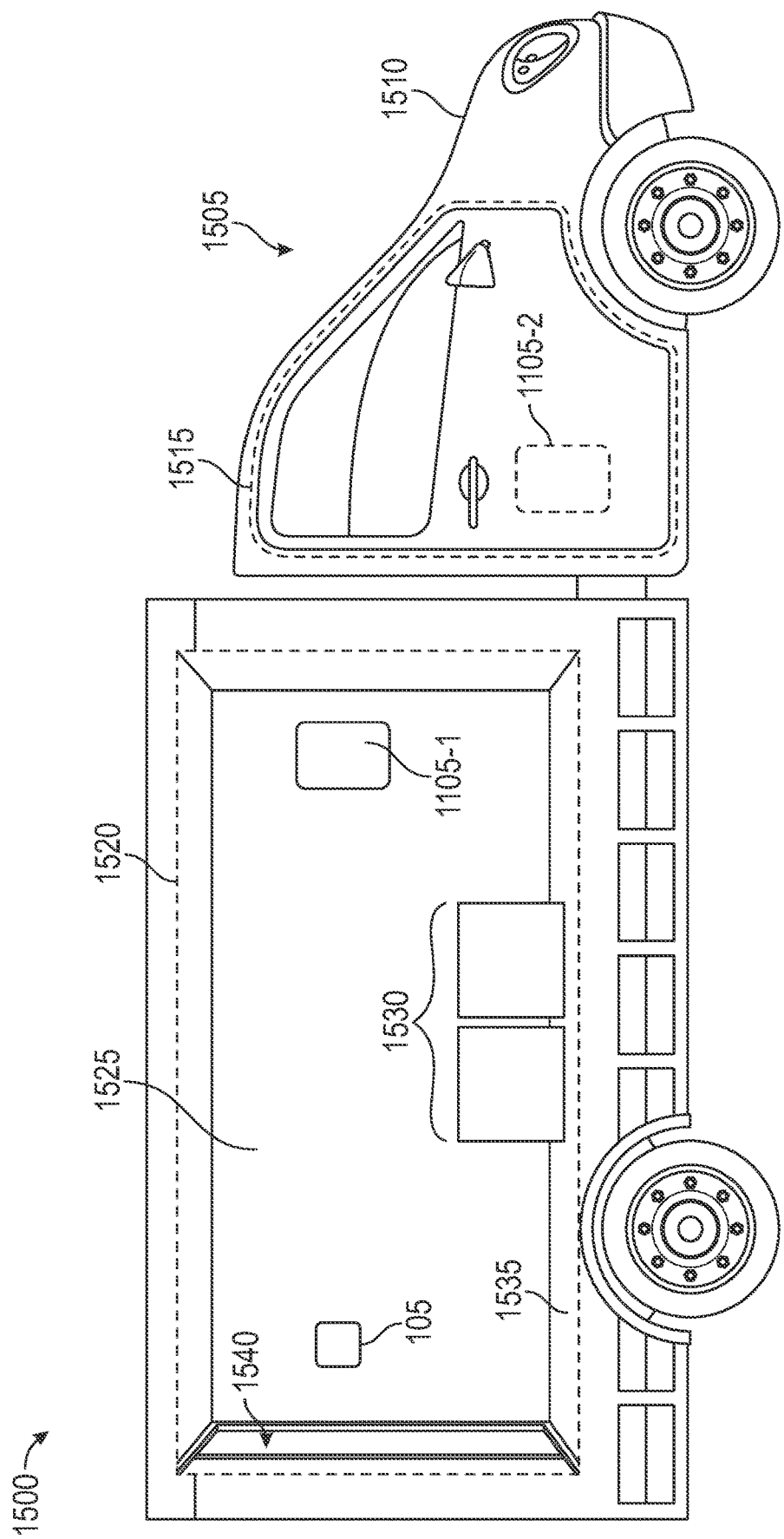
FIG. 15 illustrates deployment of a sensor device and a gateway device in a truck, according to one or more embodiments.

FIG. 15 illustrates deployment of a sensor device and a gateway device in a truck, according to one or more embodiments. The features illustrated in FIG. 15 may be used in conjunction with other embodiments described herein, such as with various embodiments of the electronic device 105.

In diagram 1500, the vehicle 1110 is implemented as a truck 1505 having a cab 1510 defining a passenger compartment 1515, and a cargo box defining a cargo compartment 1520. A wall 1525 is defined in the cargo compartment 1520, such as a side wall of the cargo box. The electronic device 105 is removably attached to the wall 1525 at an end of the wall 1525 near rear doors 1540 of the cargo box, and a first gateway device 1105-1 (representing one instance of the gateway device 1105) is attached to the wall 1525 at an opposing end. Alternative placements of the electronic device 105 and/or the first gateway device 1105-1 are also contemplated. Cargo 1530 (illustrated as multiple boxes) is disposed on a floor 1535 of the cargo box within the cargo compartment 1520.

A second gateway device 1105-2 (representing another instance of the gateway device 1105) is disposed in the passenger compartment 1515. In some embodiments, the electronic device 105 may connect to one of the first gateway device 1105-1 and the second gateway device 1105-2 using any suitable selection criteria (e.g., based on measuring a relatively greater signal strength, based on the relative capabilities of the gateway devices 1105-1, 1105-2, and so forth). In some embodiments, the gateway devices 1105-1, 1105-2 connect with each other.

Figure 16A:
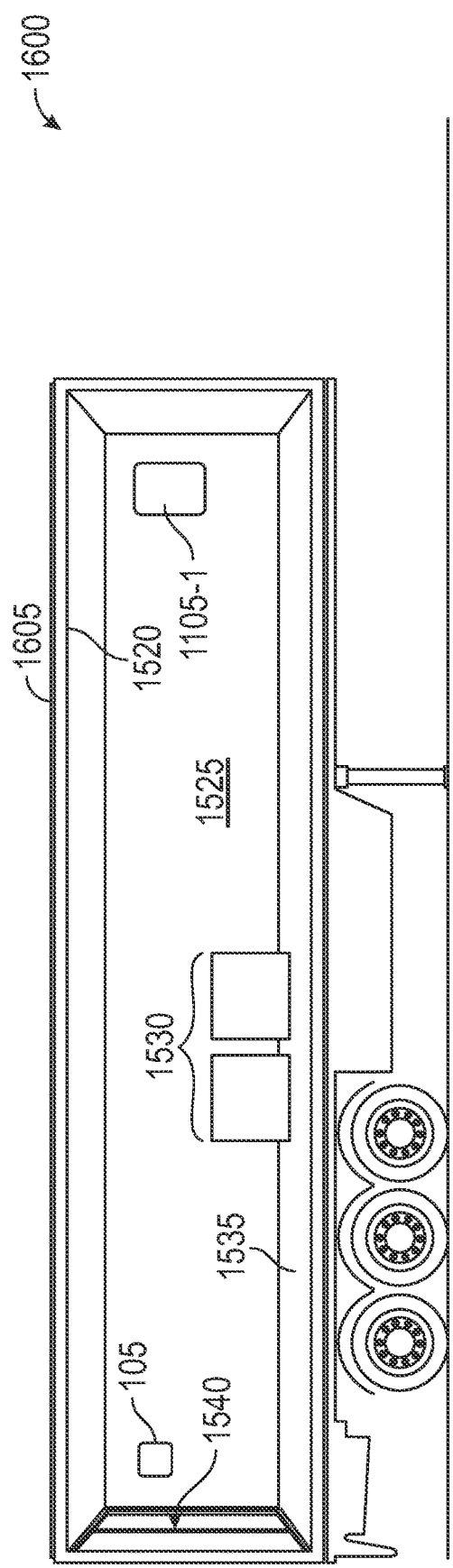
FIG. 16A illustrates deployment of a sensor device and a gateway device in an exemplary unattached trailer, according to one or more embodiments.
Figure 16B:
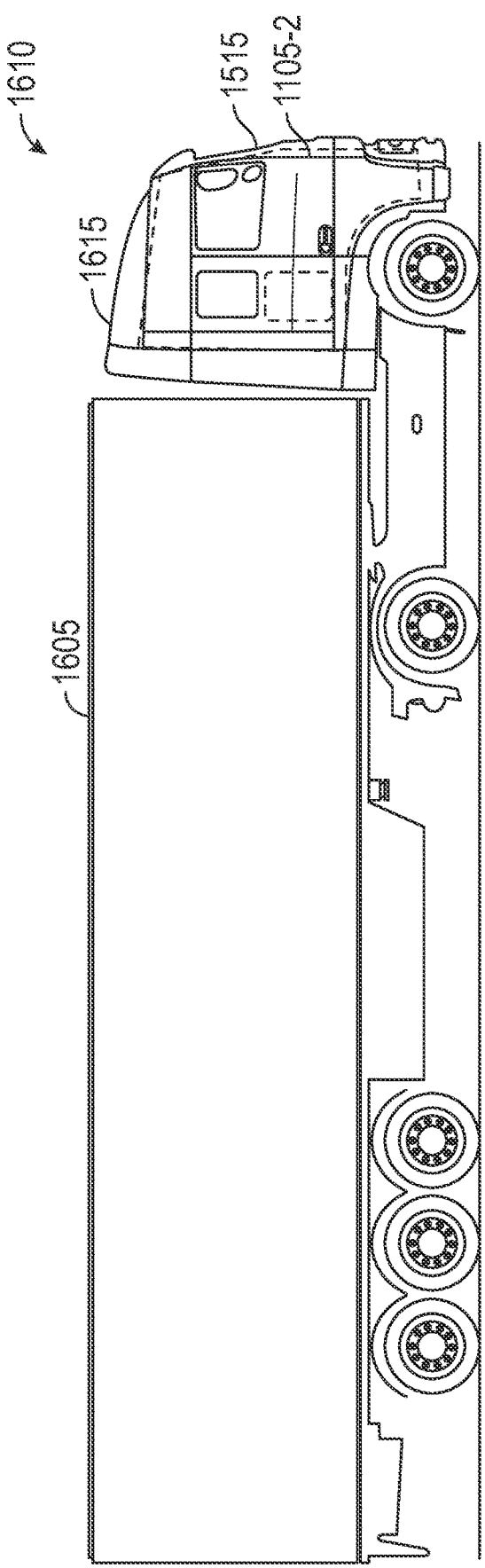
FIG. 16B illustrates attachment of the trailer to a tractor, according to one or more embodiments.

FIG. 16A illustrates deployment of a sensor device 105 and a gateway device 1105 in an exemplary unattached trailer 1605, according to one or more embodiments. FIG. 16B illustrates attachment of the trailer 1605 to a tractor 1615 (also referred to as a detachable cab), according to one or more embodiments. The features illustrated in FIGS. 16A, 16B may be used in conjunction with other embodiments described herein, such as with various embodiments of the electronic device 105.

Despite lacking a source of motive force, the trailer 1605 represents one possible implementation of the vehicle 1110. In diagram 1600, the trailer 1605 comprises the electronic device 105 and the gateway device 1105-1, which are shown in the cargo compartment 1520 as being removably attached to the wall 1525. The electronic device 105 is connected with the gateway device 1105-1 to communicate measurements of one or more environmental parameters (such as temperature measurements) of the cargo compartment 1520 to a WAN 1130. In this way, while the trailer 1605 is in an unattached configuration (e.g., stationary), the environmental parameters of the cargo compartment 1520 may be remotely monitored, e.g., by the management server 1140.

In diagram 1610, the trailer 1605 is in an attached configuration with the tractor 1615. The combination of the tractor 1615 and the trailer 1605 represents another possible implementation of the vehicle 1110. The tractor 1615 defines the passenger compartment 1515, and the second gateway device 1105-2 is disposed in the passenger compartment 1515. The electronic device 105 is connected with the gateway device 1105-1 and/or the gateway device 1105-2 to communicate measurements of one or more environmental parameters (such as temperature measurements) of the cargo compartment 1520 to a WAN 1130. In this way, while the trailer 1605 is in an attached configuration (e.g., during motive operation), the environmental parameters of the cargo compartment 1520 may be remotely monitored, e.g., by the management server 1140.

CONCLUSION

In the above description, numerous specific details such as resource partitioning/sharing/duplication embodiments, types and interrelationships of system components, and logic partitioning/integration choices are set forth in order to provide a more thorough understanding. It will be appreciated, however, by one skilled in the art, that the invention may be practiced without such specific details. In other instances, control structures, logic embodiments, opcodes, means to specify operands, and full software instruction sequences have not been shown in detail since those of ordinary skill in the art, with the included descriptions, will be able to implement what is described without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations and/or structures that add additional features to some embodiments. However, such notation should not be taken to mean that these are the only options or optional operations, and/or that blocks with solid borders are not optional in certain embodiments.

In the following description and claims, the term "coupled," along with its derivatives, may be used. "Coupled" is used to indicate that two or more elements, which may or may not be in direct physical or electrical contact with each other, co-operate or interact with each other.

The operations in the flow diagrams are be described with reference to the exemplary embodiments in the other figures. However, the operations of the flow diagrams can be performed by embodiments other than those discussed with reference to the other figures, and the embodiments discussed with reference to these other figures can perform operations different from those discussed with reference to the flow diagrams.

While the above description includes several exemplary embodiments, those skilled in the art will recognize that the invention is not limited to the embodiments described and can be practiced with modification and alteration within the spirit and scope of the appended claims. The description is thus illustrative instead of limiting.

What is claimed is:

1. An electronic device comprising:
    an enclosure that defines an internal volume, a plurality of external surfaces, and a recess from an external surface of the plurality of external surfaces, the recess having one or more circumferential slots that extend to the external surface and that receive one or more flanges of an external connector;
    one or more electronic components disposed in the internal volume; and
    a connector interface connected with the one or more electronic components, the connector interface comprising one or more first conductors that are exposed at the recess,
    wherein, while the one or more flanges are received in the one or more circumferential slots, rotation of the external connector causes the one or more flanges to slide within the one or more circumferential slots into a retained position of the external connector, in which one or more second conductors of the external connector, having a fixed disposition relative to the one or more flanges, are connected to the one or more first conductors, wherein the one or more second conductors comprise a plurality of second conductors in a linear disposition, wherein the one or more first conductors include one or more arcuate conductors that connect to a corresponding one or more of the plurality of second conductors for a range of rotational positions of the external connector including the retained position.

2. The electronic device of claim 1, wherein the one or more first conductors comprise a plurality of first conductors in a concentric disposition.

3. The electronic device of claim 2, wherein the plurality of first conductors comprises a central conductor and a plurality of arcuate conductors.

4. The electronic device of claim 1, wherein each of the one or more circumferential slots defines:
    a first section extending, parallel to an axis of rotation of the external connector, from the external surface to a first depth; and
    a second section extending circumferentially from the first depth.

5. The electronic device of claim 4, wherein a detent is disposed at an end of the second section opposite the first section, the detent to engage a flange when the external connector is in the retained position.

6. The electronic device of claim 1, wherein the one or more first conductors comprise a plurality of first conductors, the plurality of first conductors and the plurality of second conductors disposed such that the plurality of second conductors connect to corresponding conductors of the plurality of first conductors sequentially with the rotation of the external connector toward the retained position.

7. The electronic device of claim 6, wherein the plurality of first conductors comprises one or more power conductors and one or more signal conductors, wherein corresponding conductors of the plurality of second conductors connect to the one or more power conductors before corresponding conductors of the plurality of second conductors connect to the one or more signal conductors.

8. The electronic device of claim 6, wherein some or all of the plurality of first conductors are radially staggered.

9. The electronic device of claim 6, wherein the plurality of second conductors comprise spring-loaded pins.

10. The electronic device of claim 1, wherein the one or more electronic components comprise a temperature sensor, wireless transmitter circuitry, and a power source, the connector interface to connect the wireless transmitter circuitry and the power source with an external temperature sensor.

11. A connector interface comprising:
    a body defining a first surface, a recess from the first surface, and a second surface disposed at the recess and recessed from the first surface, the recess having one or more circumferential slots that extend into the body from the first surface; and
    one or more first conductors that are exposed at the second surface, wherein, while one or more flanges of an external connector are received in the one or more circumferential slots, relative rotation of the body with the external connector causes the one or more flanges to slide within the one or more circumferential slots into a retained position of the external connector, in which one or more second conductors of the external connector, having a fixed disposition relative to the one or more flanges, are connected to the one or more first conductors, wherein the one or more second conductors comprise a plurality of second conductors in a linear disposition, wherein the one or more first conductors include one or more arcuate conductors that connect to a corresponding one or more of the plurality of second conductors for a range of rotational positions of the external connector including the retained position.

12. The connector interface of claim 11, wherein the first surface comprises an external surface of an electronic device.

13. The connector interface of claim 11, wherein the one or more first conductors comprise a plurality of first conductors in a concentric disposition.

14. The connector interface of claim 13, wherein the plurality of first conductors comprises a central conductor and a plurality of arcuate conductors.

15. The connector interface of claim 11, wherein each of the one or more circumferential slots defines:
   a first section extending, parallel to an axis of rotation of the external connector, from the first surface to a first depth; and
   a second section extending circumferentially from the first depth.

16. The connector interface of claim 15, wherein a detent is disposed at an end of the second section opposite the first section, the detent to engage a flange when the external connector is in the retained position.

17. The connector interface of claim 15, wherein the second section extends from the first depth at the first section, to a second depth at an end of the second section opposite the first section, wherein rotation of the external connector toward the retained position causes the one or more second conductors to advance along the axis of rotation.

18. The connector interface of claim 11, wherein the one or more first conductors comprise a plurality of first conductors that are radially staggered.

* * * * *